US012660109B2

(12) United States Patent
Lee et al.

(10) Patent No.: US 12,660,109 B2
(45) Date of Patent: Jun. 16, 2026

(54) DISPLAY DEVICE

(71) Applicant: LG ELECTRONICS INC., Seoul (KR)

(72) Inventors: Kangyeung Lee, Seoul (KR); Sanghoon Kim, Seoul (KR); Hyunjin Jung, Seoul (KR); Chunho Byun, Gyounggi-do (KR)

(73) Assignee: LG ELECTRONICS INC., Seoul (KR)

( * ) Notice: Subject to any disclaimer, the term of this patent is extended or adjusted under 35 U.S.C. 154(b) by 110 days.

(21) Appl. No.: 18/807,234

(22) Filed: Aug. 16, 2024

(65) Prior Publication Data

US 2025/0071919 A1     Feb. 27, 2025

(30) Foreign Application Priority Data

Aug. 21, 2023     (KR) ........................ 10-2023-0109083

(51) Int. Cl.
H05K 5/02          (2006.01)
F16M 11/14        (2006.01)
(Continued)

(52) U.S. Cl.
CPC .......... H05K 5/0234 (2013.01); F16M 11/14 (2013.01); F16M 11/2064 (2013.01);
(Continued)

(58) Field of Classification Search
CPC ........................... H05K 5/0234; H05K 5/0222
See application file for complete search history.

(56) References Cited

U.S. PATENT DOCUMENTS 6,268,997 B1     7/2001  Hong
2003/0001057 A1*  1/2003  Sweere ................. G06F 1/1601
                                                          248/276.1
(Continued)

FOREIGN PATENT DOCUMENTS

KR         20-0327070         9/2003
KR         10-1656614         9/2016
(Continued)

OTHER PUBLICATIONS

Korean Intellectual Property Office Application No. 10-2023-0109083, Office Action dated Mar. 24, 2025, 6 pages.
(Continued)

*Primary Examiner* — Jerry Wu
(74) *Attorney, Agent, or Firm* — LEE, HONG, DEGERMAN, KANG & WAIMEY

(57)     ABSTRACT

A display device is disclosed. The display device may include a display panel, a clip located behind the display panel, a support arm extending long and located between the display panel and the clip, the support arm including a first end rotatably coupled to the clip and a second end rotatably coupled to the display panel, a shaft penetrating a first side of the clip and the first end of the support arm, fixed to the clip, and providing a rotational central axis of the first end of the support arm, a pin penetrating a second side of the clip opposite to the first side, coupled to the shaft, and including a head opposite to the first end of the support arm, and a first washer located between the head of the pin and the first end of the support arm, and through which the shaft passes, the head of the pin may press the first washer toward the first end of the support arm.

13 Claims, 28 Drawing Sheets

(51) Int. Cl.
  F16M 11/20    (2006.01)
  *F16M 11/42*    (2006.01)

(52) U.S. Cl.
  CPC ....... *F16M 11/42* (2013.01); *F16M 2200/022*
    (2013.01); *F16M 2200/044* (2013.01); *F16M*
           *2200/068* (2013.01)

(56)       References Cited

U.S. PATENT DOCUMENTS

| | | |
|---|---|---|
| 2011/0147546 A1 | 6/2011 | Monsalve et al. |
| 2016/0037663 A1* | 2/2016 | Lau ..................... F16M 13/022 |
| | | 248/277.1 |

FOREIGN PATENT DOCUMENTS

| | | |
|---|---|---|
| KR | 10-2018-0121979 | 11/2018 |
| KR | 10-2023-0099208 | 7/2023 |

OTHER PUBLICATIONS

Korean Intellectual Property Office Application No. 10-2023-0109083, Office Action dated Dec. 29, 2025, 10 pages.

\* cited by examiner

DISPLAY DEVICE

CROSS-REFERENCE TO RELATED APPLICATIONS

Pursuant to 35 U.S.C. § 119(a), this application claims the benefit of earlier filing date and right of priority to Korean Patent Application No. 10-2023-0109083, filed on Aug. 21, 2023, the contents of which are all hereby incorporated by reference herein in their entireties.

BACKGROUND OF THE INVENTION

Field of the Invention

The present disclosure relates to a display device.

Description of the Related Art

As the information society develops, a demand for display devices is increasing in various forms. In response to this, various display devices such as an LCD (Liquid Crystal Display Device), a PDP (Plasma Display Panel), an ELD (Electro luminescent display), a VFD (Vacuum Fluorescent Display), and an OLED (Organic Light Emitting Diode) have been recently researched and used.

Among these, an LCD panel may be provided with a TFT substrate and a color substrate that are opposite to each other with a liquid crystal layer interposed therebetween, and may display an image using light provided from a backlight unit. Further, an OLED panel may display an image by depositing an organic-matter layer that may itself emit light on a substrate on which a transparent electrode is formed.

Recently, much research has been conducted on structures that freely adjust the angle or position of the display.

SUMMARY OF THE INVENTION

An object of the present disclosure is to solve the above and other problems.

Another object of the present disclosure may be to provide a display device including a stand that supports a display panel.

Another object of the present disclosure may be to provide a structure that can freely adjust the angle or height of a display panel.

Another object of the present disclosure may be to provide a display device with minimized external exposure of a cable.

In accordance with an aspect of the present disclosure for achieving the above and other objects, a display device may include a display panel, a clip located behind the display panel, a support arm extending long and located between the display panel and the clip, the support arm including a first end rotatably coupled to the clip and a second end rotatably coupled to the display panel, a shaft penetrating a first side of the clip and the first end of the support arm, fixed to the clip, and providing a rotational central axis of the first end of the support arm, a pin penetrating a second side of the clip opposite to the first side, coupled to the shaft, and including a head opposite to the first end of the support arm, and a first washer located between the head of the pin and the first end of the support arm, and through which the shaft passes, the head of the pin may press the first washer toward the first end of the support arm.

BRIEF DESCRIPTION OF THE DRAWINGS

The above and other objects, features and advantages of the present invention will be more apparent from the following detailed description in conjunction with the accompanying drawings, in which:

FIGS. 1 to 28 are diagrams showing examples of display devices according to embodiments of the present disclosure.

DETAILED DESCRIPTION

Figure 1:
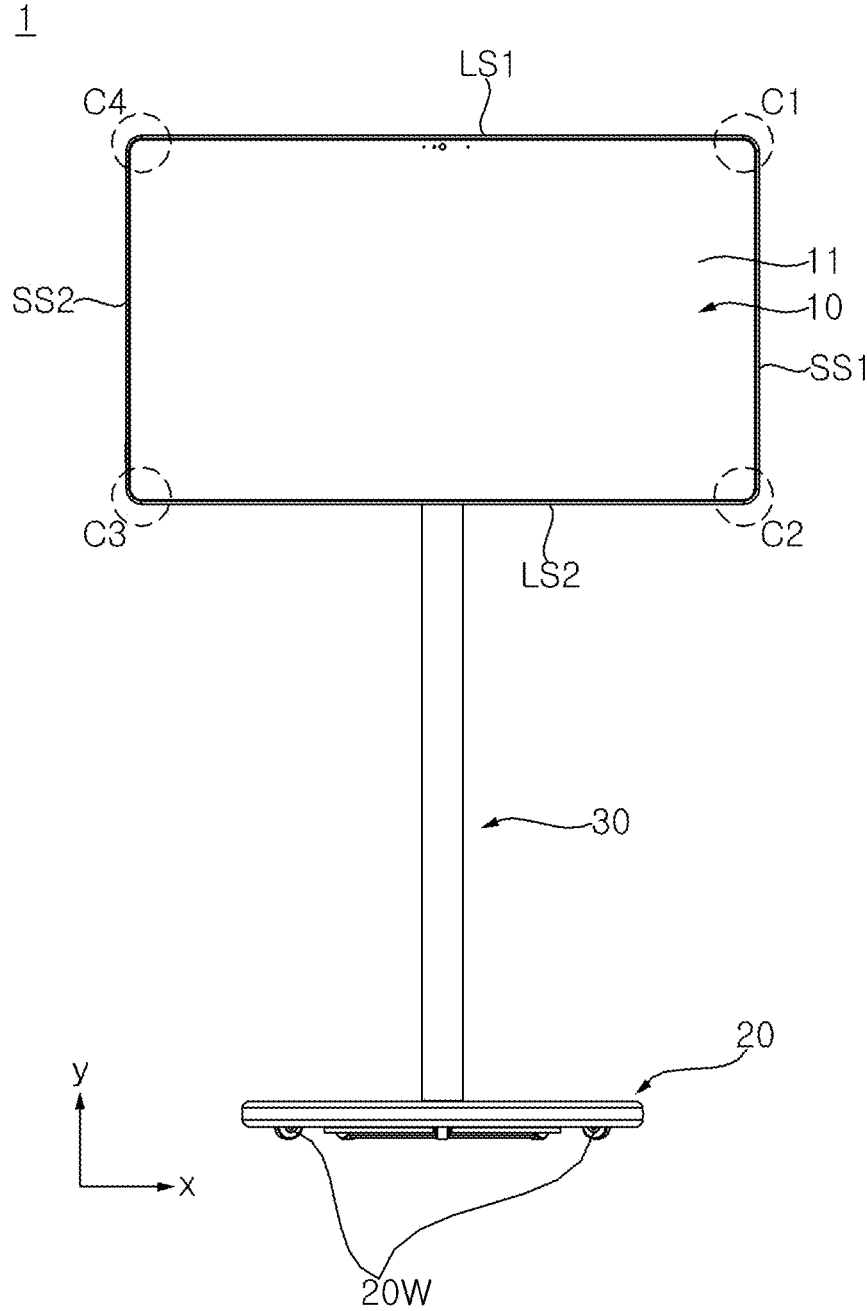

Hereinafter, the exemplary embodiments of the present disclosure will be described in detail with reference to the accompanying drawings. The same reference numerals are used throughout the drawings to designate the same or similar components.

The words "module" and "part" for components used in the following description are given or used interchangeably only for the case of preparing the specification, and do not have distinct meanings or roles in themselves.

In the following description, if it is decided that the detailed description of known technologies related to the present disclosure makes the subject matter of the embodiments described herein unclear, the detailed description is omitted. Further, the accompanying drawings are provided only for easy understanding of embodiments disclosed in the specification, and the technical spirit disclosed in the specification is not limited by the accompanying drawings, and all changes, equivalents, and replacements should be understood as being included in the spirit and scope of the present disclosure.

It will be understood that, although the terms "first", "second", etc. may be used herein to describe various components, these components should not be limited by these terms. These terms are only used to distinguish one component from another component.

It will be understood that when a component is referred to as being "coupled" or "connected" to another component, it can be directly coupled or connected to the other component or intervening components may be present therebetween. In contrast, it should be understood that when a component is referred to as being "directly coupled" or "directly connected" to another component, there are no intervening components present.

In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

The direction indications of up (U), down (D), left (Le), right (Ri), front (F), and rear (R) shown in the drawings are merely for convenience of explanation. The technical idea disclosed herein is not limited thereto.

Figure 2:
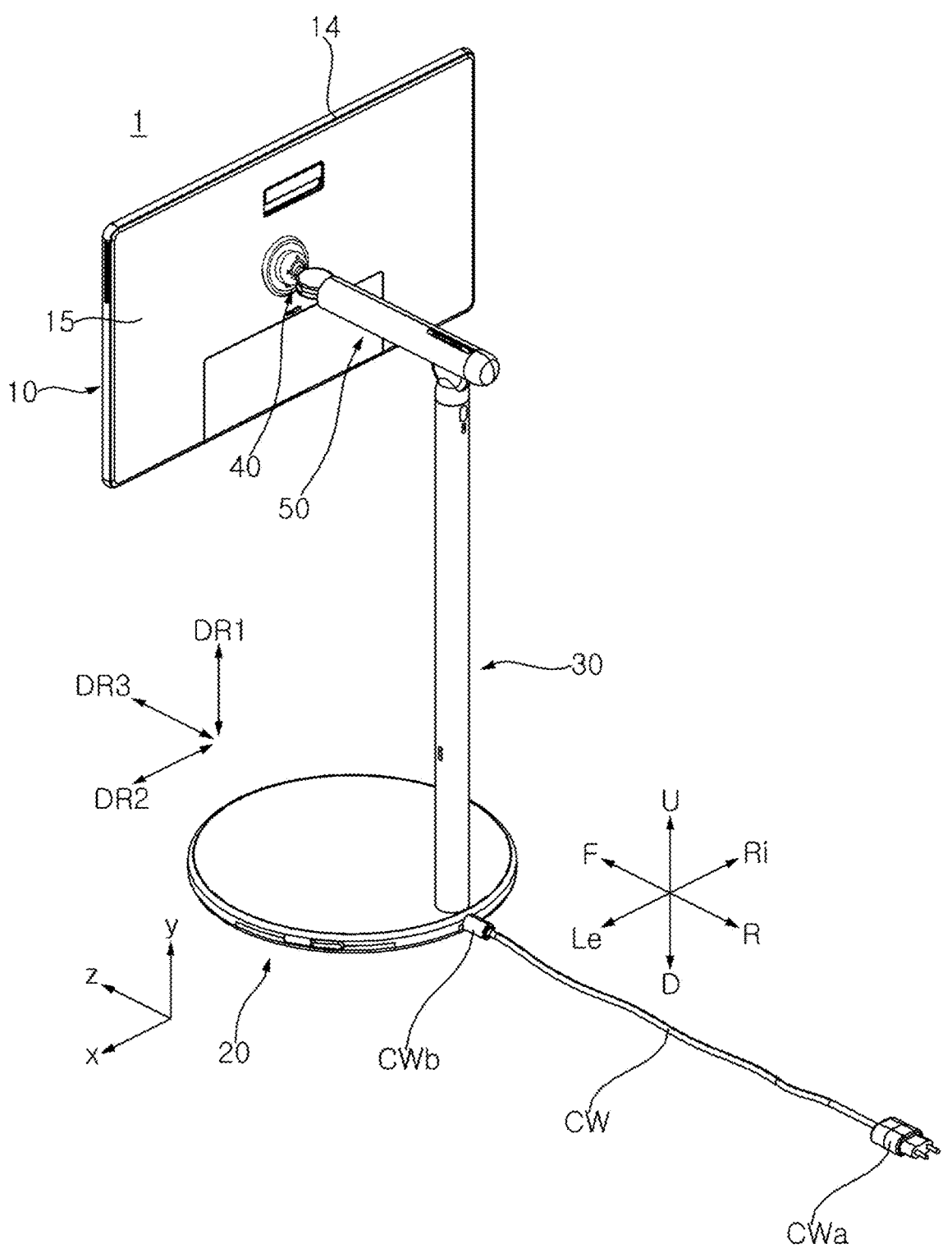

Referring to FIGS. 1 and 2, a display device 1 may include a head 10. The head 10 may include a display panel 11 that displays an image. The head 10 may be referred to as a display 10 or a display unit 10.

The head 10 may include a first long side LS1, a second long side LS2 that is opposite to the first long side LS1, a first short side SS1 that is adjacent to the first long side LS1 and the second long side LS2, and a second short side SS2 that is opposite to the first short side SS1. Meanwhile, for convenience of explanation, the lengths of the first and second long sides LS1 and LS2 are illustrated as being longer than the lengths of the first and second short sides SS1 and SS2. However, the lengths of the first and second long sides LS1 and LS2 may be approximately equal to the lengths of the first and second short sides SS1 and SS2.

A direction parallel to the short sides SS1 and SS2 of the head 10 may be referred to as an up-down direction or a first direction DR1. A direction parallel to the long sides LS1 and LS2 of the head 10 may be referred to as a left-right direction or a second direction DR2. A direction perpendicular to the short sides SS1 and SS2 and the long sides LS1 and LS2 of the head 10 may be referred to as a front-rear direction or a third direction DR3.

A direction in which the head 10 displays an image may be referred to as a front F or z, while the opposite direction may be referred to as the rear R. The first short side SS1 may be referred as a left side Le or x. The second short side SS2 may be referred to as a right side Ri. The first long side LS1 may be referred to as an upper side U or y. The second long side LS2 may be referred to as a lower side D.

The first long side LS1, the second long side LS2, the first short side SS1, and the second short side SS2 may be referred to as edges of the head 10. Points where the first long side LS1, the second long side LS2, the first short side SS1, and the second short side SS2 meet each other may be referred to as corners. A point where the first short side SS1 and the first long side LS1 meet may be a first corner C1. A point where the first short side SS1 and the second long side LS2 meet may be a second corner C2. A point where the second short side SS2 and the second long side LS2 meet may be a third corner C3. A point where the second short side SS2 and the first long side LS1 meet may be a fourth corner C4.

The display device 1 may include a stand 20, 30, 40, and 50 to support the head 10. The stand 20, 30, 40, and 50 may include a base 20, a pole 30, a rotary connector 40, and a support arm 50.

The base 20 may be placed on a ground. The base 20 may be round or angular. A plurality of wheels 20W may be provided on a lower surface of the base 20. A plug CWa of the power cable CW may be connected to a concentric plug that supplies external power, and a jack CWb of the power cable CW may be connected to the base 20. A battery (not shown) may be embedded in the base 20, the pole 30, the support arm 50, and/or the head 10, and may be charged by power supplied through the power cable CW. The display device 1 may receive power from the battery, and may be operated while being disconnected from the cable CW.

The pole 30 may extend vertically from the base 20. A lower end of the pole 30 may be coupled to the base 20 adjacent to the perimeter of the base 20.

The support arm 50 may extend in a direction intersecting the pole 30, and may be coupled to an upper end of the pole 30. The rotary connector 40 may be located between the head 10 and the pole 30 to be coupled to the head 10 and the pole 30.

Thus, the head 10 may be supported by the stand 20, 30, 40, and 50 to be spaced apart from the ground.

Figure 3:
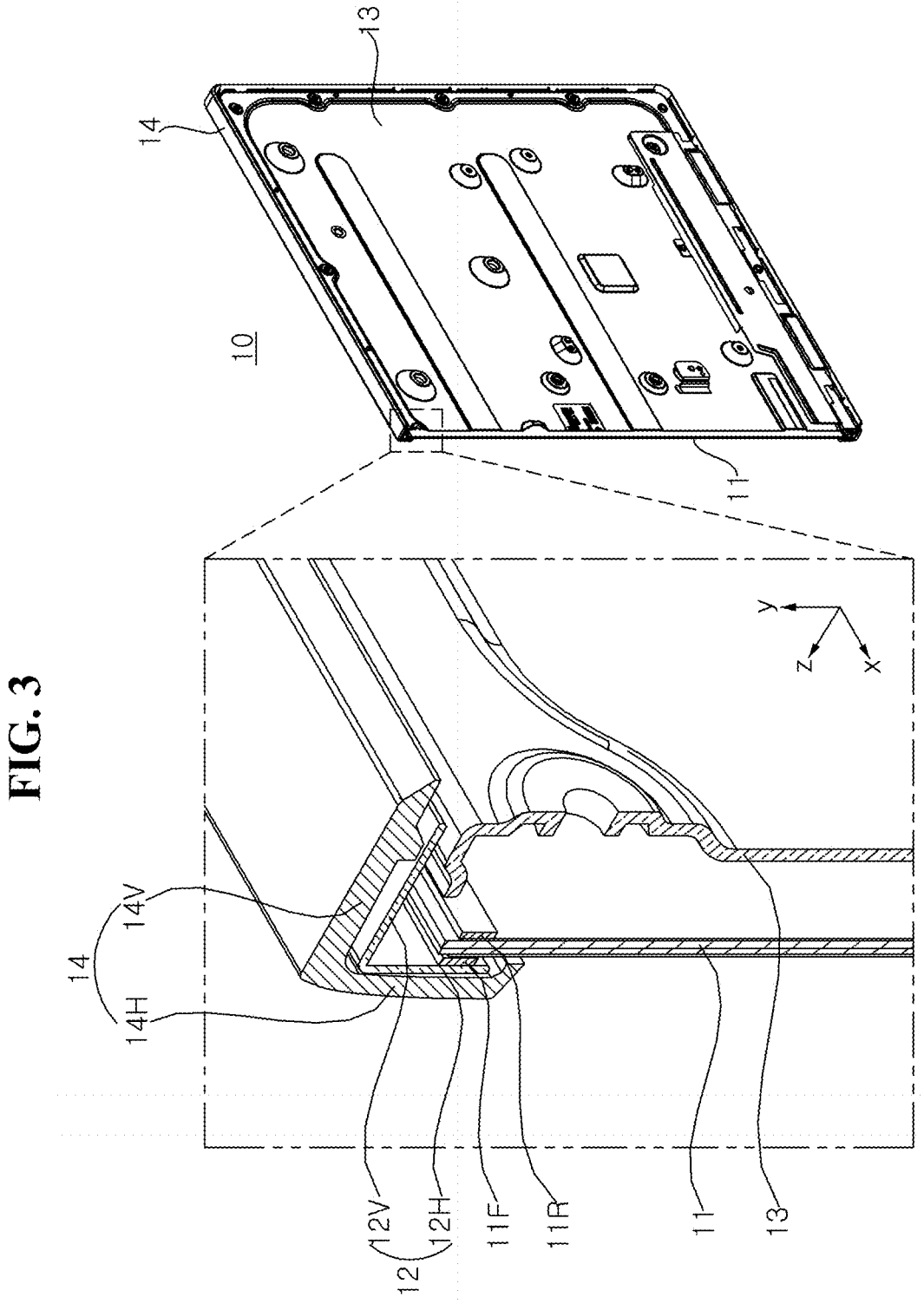
Figure 4:
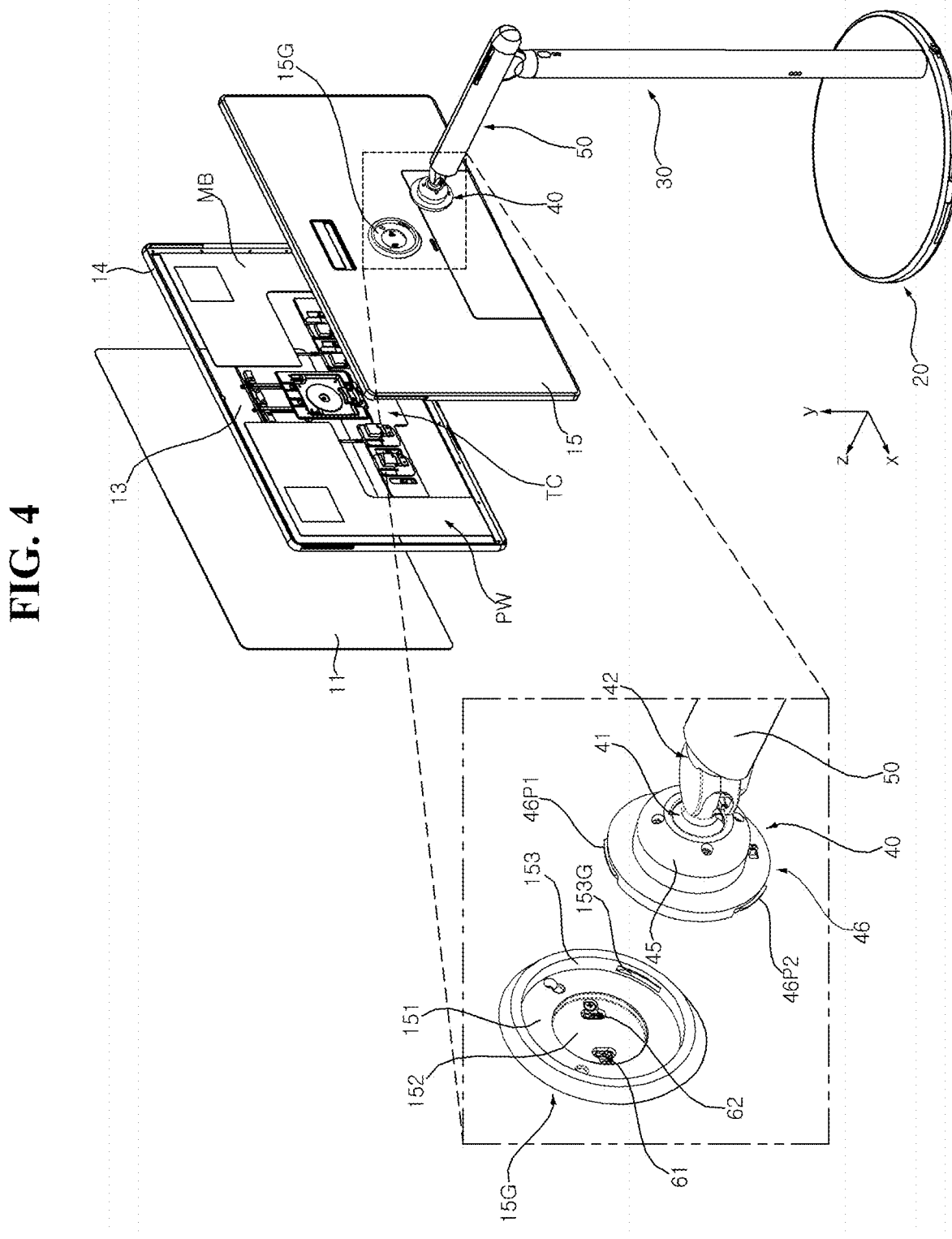

Referring to FIGS. 3 and 4, the head 10 may include a display panel 11, a middle cabinet 12, a frame 13, an end frame 14, and a back cover 15.

The display panel 11 may form the front of the head 10. For example, the display panel 11 may be an LCD panel, an OLED panel, or an LED panel. If the display panel 11 is the LCD panel, the head 10 may include a backlight unit that provides light to the display panel 11. The display panel 11 may divide an image into a plurality of pixels and output the image by adjusting the color, brightness, and saturation for each pixel. The display panel 11 may be divided into an active area where the image is displayed and a de-active area where no image is displayed. The display panel 11 may generate light corresponding to red, green, or blue colors depending on a control signal.

The middle cabinet 12 may extend along the perimeter of the display panel 11. A horizontal portion 12H may be located in front of the display panel 11. A vertical portion 12V may intersect the horizontal portion 12H, and cover a side of the display panel 11.

The frame 13 may be located in back of the display panel 11. Electronic components such as a PCB (Printed Circuit Board) may be coupled to the frame 13. A power supply board (PW), a timing controller board (TC), and a main board (MB) may be mounted on the rear of the frame 13.

The end frame 14 may form the perimeter of the head 10. The horizontal portion 14H may be located in front of the horizontal portion 12H of the middle cabinet 12. The vertical portion 14V may cover a side of the vertical portion 12V of the middle cabinet 12.

The back cover 15 may form the rear of the head 10. The back cover 15 may cover the rear of the frame 13, and may be coupled to the frame 13.

Figure 5:
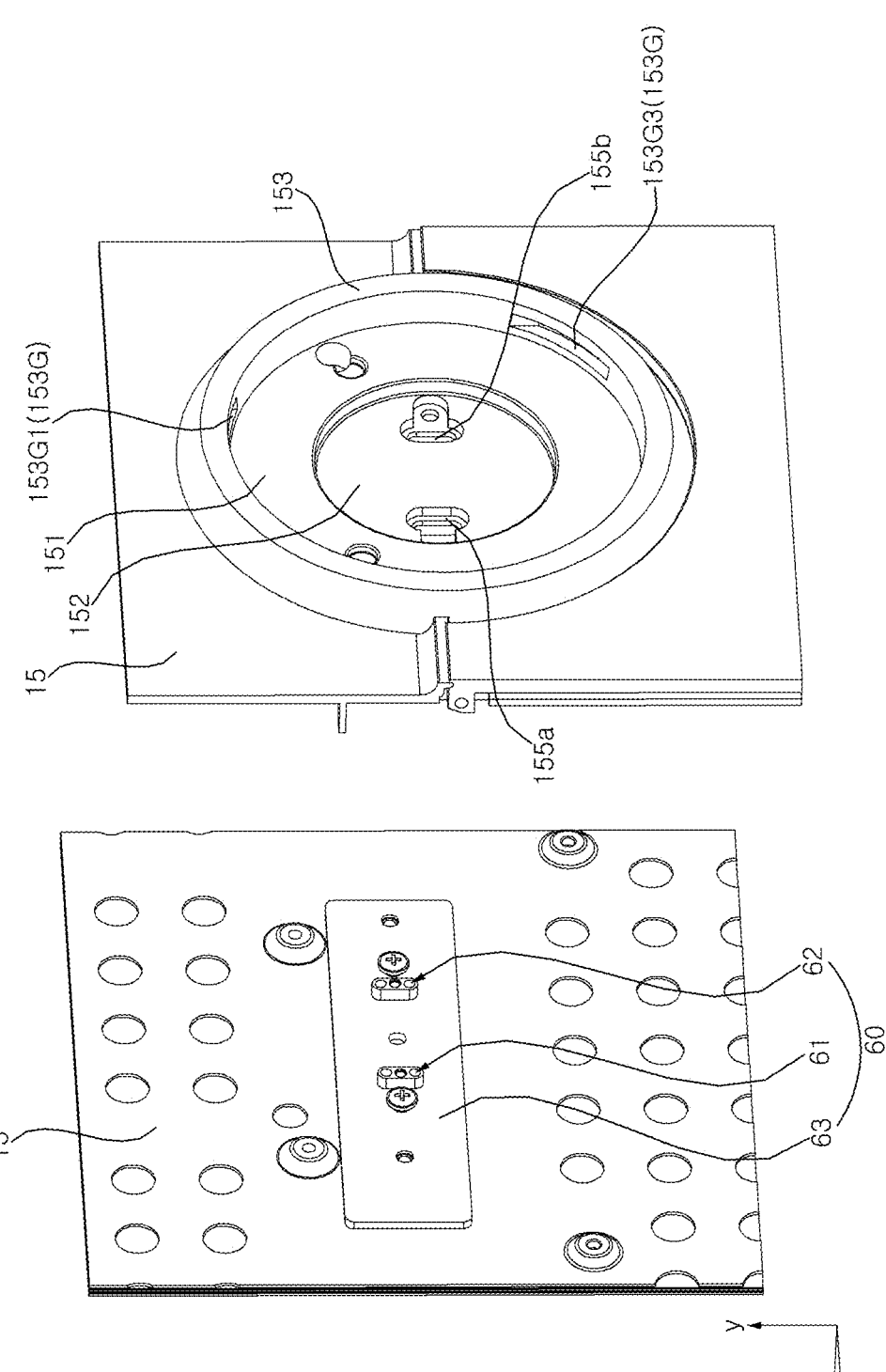

Referring to FIGS. 4 and 5, a mounting portion 15G may be formed on the rear of the back cover 15. The mounting portion 15G may be a portion of the back cover 15. Alternatively, the mounting portion 15G may be detachably coupled to a portion of the back cover 15. The mounting portion 15G may include seating portions 151 and 152 and a rib 153. The seating portions 151 and 152 may be a circular plate that is stepped in two stages, and may be coupled to the frame 13 through a fastening member such as a screw. The rib 153 may extend along the perimeter of the seating portions 151 and 152, and a groove 153G may be formed on the inner surface of the rib 153.

The rotary connector 40 may be located in back of the mounting portion 15G. The rotary connector 40 may be seated on the seating portions 151 and 152 of the mounting portion 15G, and protrusions 46P1, 46P2, and 46P3 (see FIG. 26) of the rotary connector 40 may be fixedly inserted into grooves 153G1, 153G2, and 153G3 of the mounting portion 15G. Thus, the rotary connector 40 may be coupled to the head 10.

Figure 6:
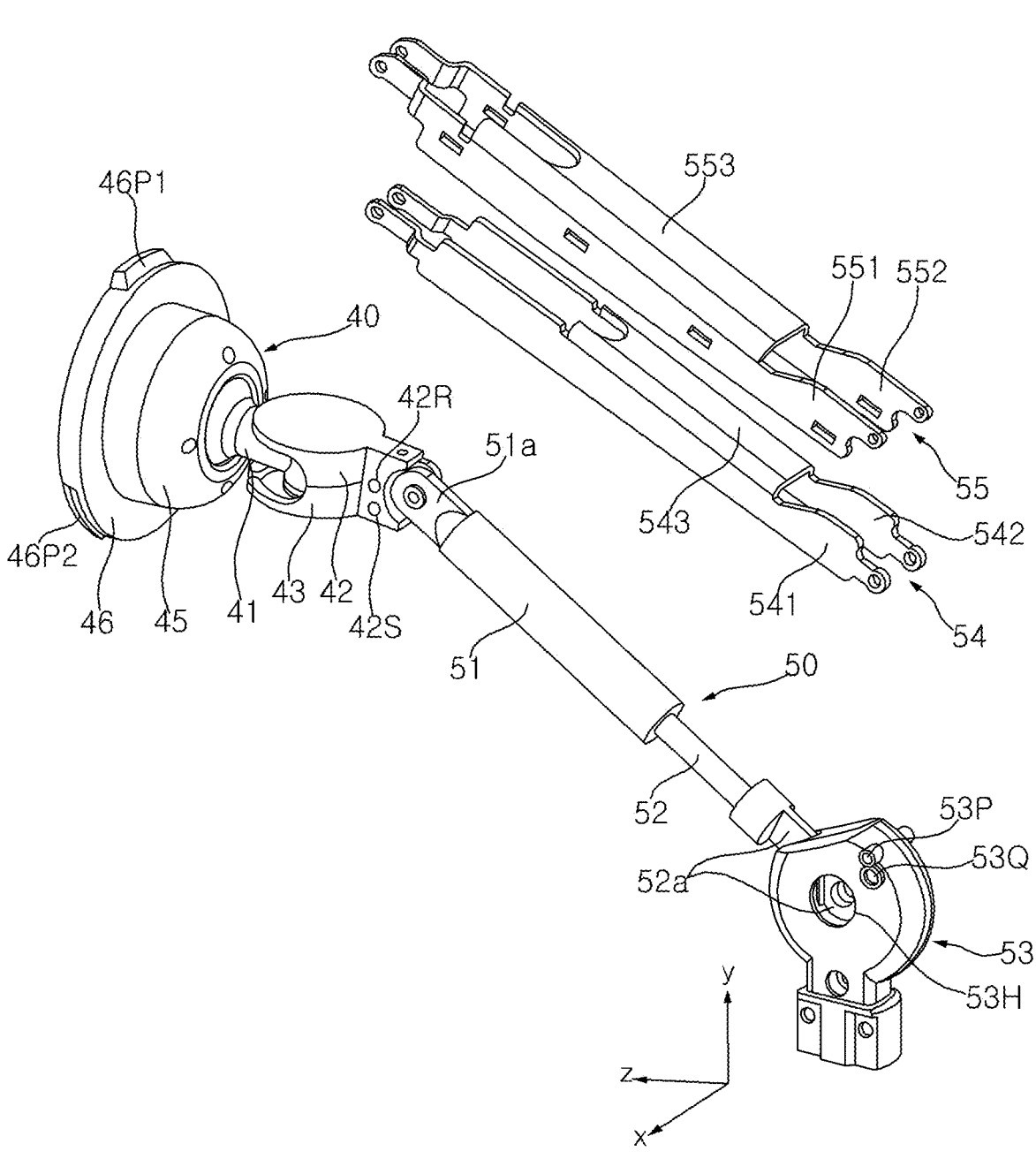

Referring to FIG. 6, the support arm 50 may include supporter 51 and 52, a lower arm 54, and an upper arm 55. The support arm 50 may connect the rotary connector 40 and the pole 30 (see FIG. 4). A clip 53 may be coupled to an upper end of a pole 30 (see FIG. 4), and one end of the support arm 50 may be rotatably coupled to the clip 53. Alternatively, the clip 53 may be a portion of the pole 30.

The supporter 51 and 52 may include a cylinder 51 and a rod 52. The supporter 51 and 52 may be gas springs 51 and 52 or hydraulic springs 51 and 52.

The cylinder 51 may extend long between the clip 53 and the rotary connector 40. The rod 52 may extend in a longitudinal direction of the cylinder 51, and may have a smaller diameter than the cylinder 51. A portion of the rod 52 may be inserted into the cylinder 51, and the rod 52 may reciprocate linearly along the cylinder 51.

Gas such as compressed nitrogen may be filled in the cylinder 51, and a piston (not shown) fixed to one end of the rod 52 may be located in the cylinder 51. Alternatively, oil as well as gas may be filled in the cylinder 51. The piston may divide the internal space of the cylinder 51 into two spaces, and the two spaces may communicate with each other through an orifice formed in the piston. At this time, the area of a first surface of the piston to which one end of the rod 52 is fixed may be smaller than the area of a second surface of the piston, which is opposite to the first surface. Thus, as gas flows through the orifice, the rod 52 may move in a direction in which it is inserted into the cylinder 51 or in the opposite direction.

The lower arm 54 may include a first lower bar 541, a second lower bar 542, and a lower bridge 543. The first lower bar 541 and the second lower bar 542 may extend along the longitudinal direction of the supporter 51 and 52, and may be opposite to each other with respect to the supporter 51 and 52. The lower bridge 543 may connect an upper side of the first lower bar 541 and an upper side of the second lower bar 542, and may be located above the supporter 51 and 52.

The upper arm 55 may be opposite to the supporter 51 and 52 with respect to the lower arm 54. The upper arm 55 may include a first upper bar 551, a second upper bar 552, and an upper bridge 553. The first upper bar 551 and the second upper bar 552 may extend along the longitudinal direction of the lower arm 54, and may be opposite to each other with respect to the lower arm 54. The upper bridge 553 may connect an upper side of the first upper bar 551 and an upper side of the second upper bar 552, and may be located above the lower bridge 543 of the lower arm 54.

Figure 7:
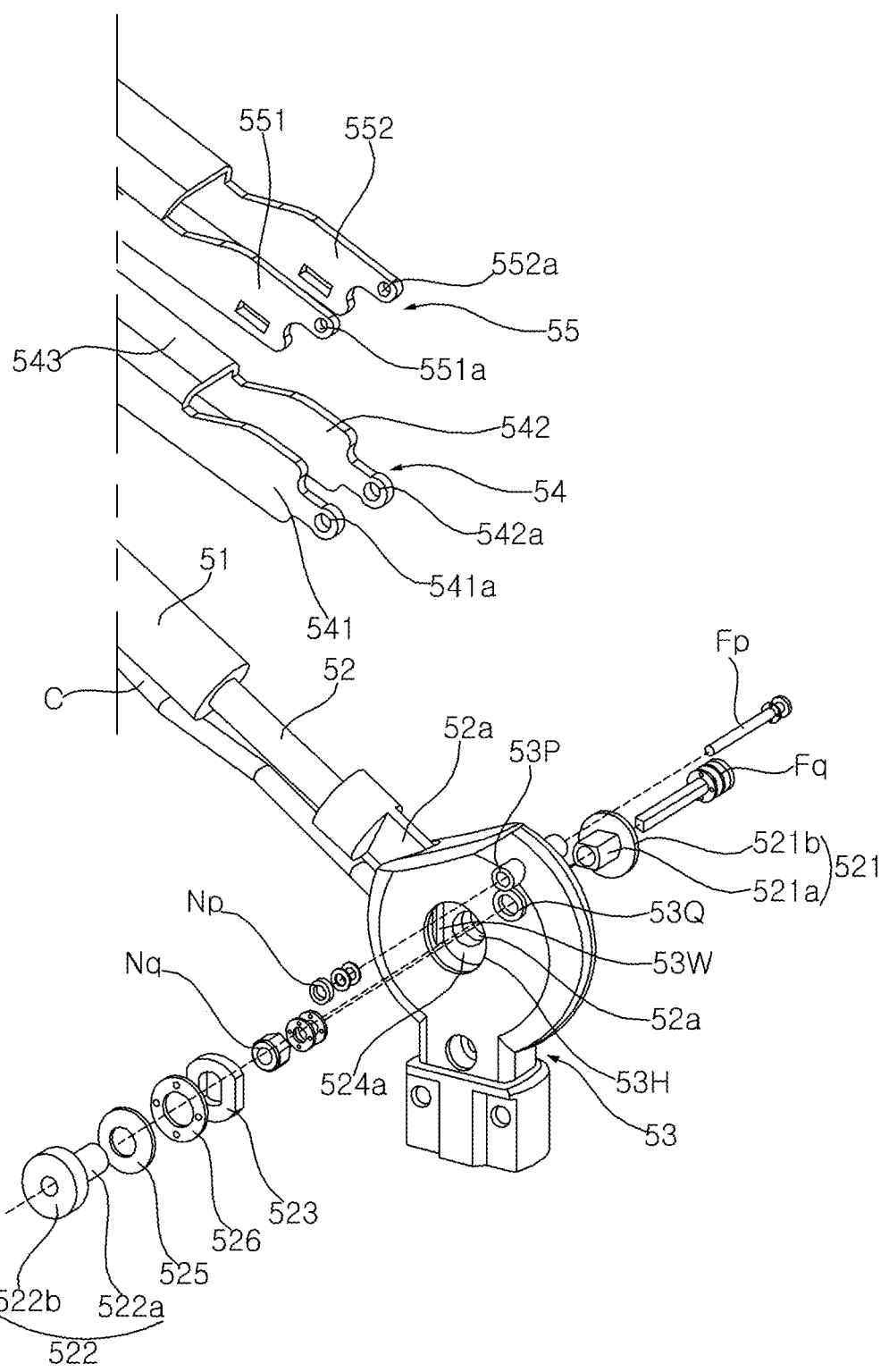
Figure 8:
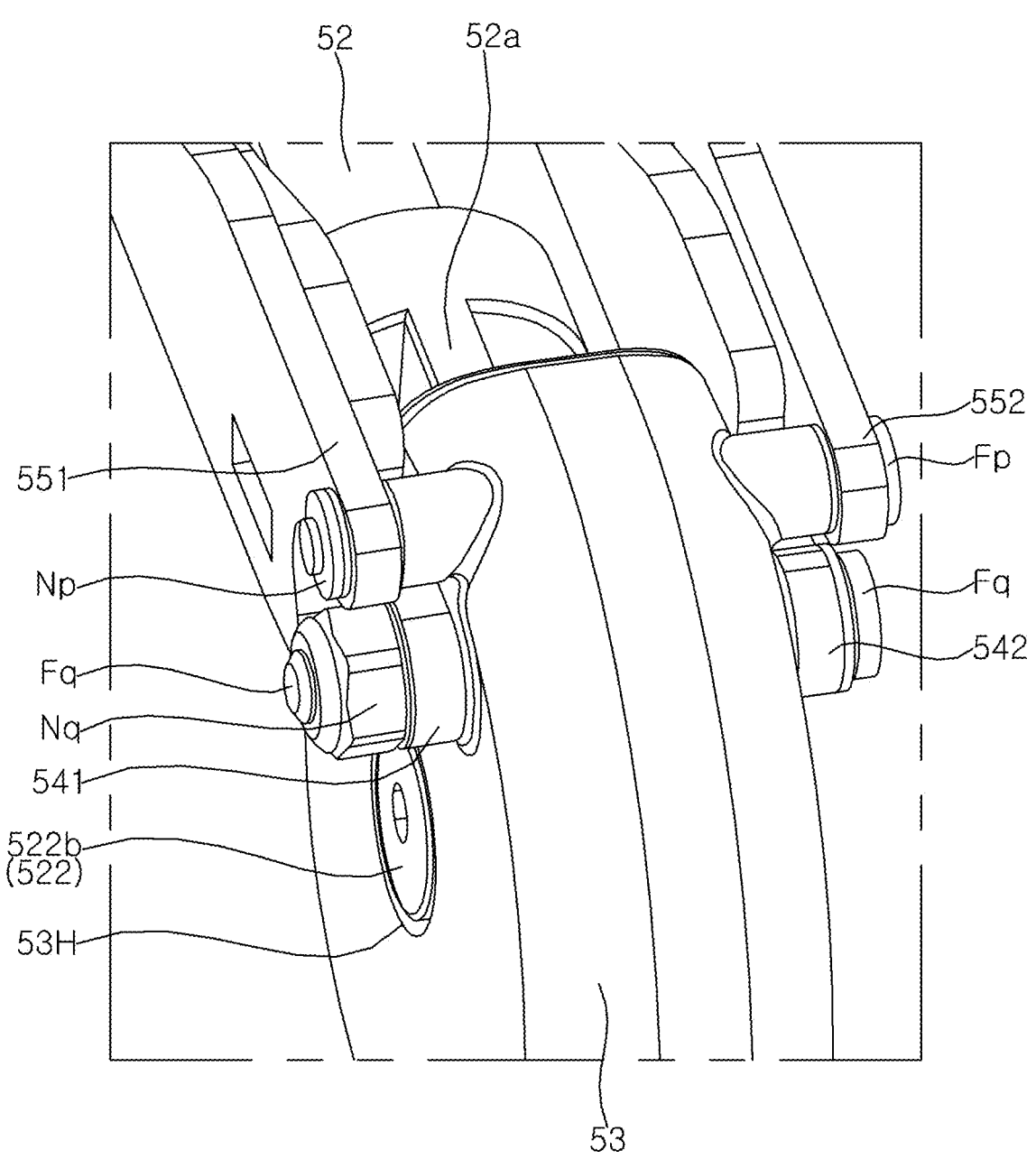
Figure 9:
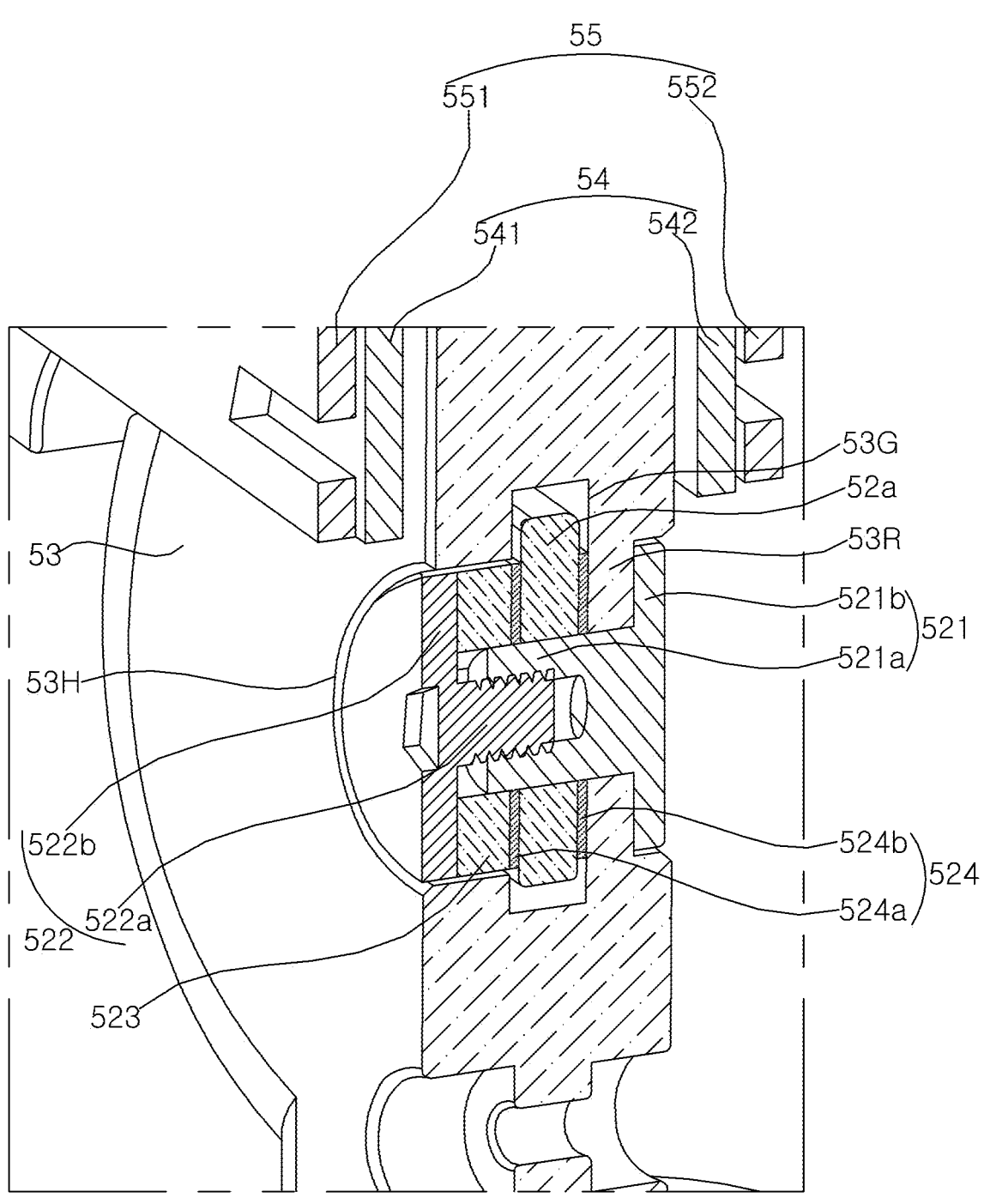

Referring to FIGS. 7 to 9, a first end fitting 52a may protrude from an end of the rod 52. The first end fitting 52a may be movably inserted into the groove 53G that is formed in the clip 53.

A body 521a of a shaft 521 may penetrate one side (i.e. right side) of the clip 53 and the first end fitting 52a. The body 521a may have a cylindrical shape with a portion of an outer surface thereof being angled. The body 521a may have a cylindrical shape with a portion of the outer surface thereof cut-out, and a pair of cut-outs (unlabeled) may be opposite to each other. The head 521b of the shaft 521 may be formed on the end of the body 521a in a flange shape, and may be seated on an inner rib 53R of the clip 53.

A body 522a of a pin 522 may penetrate the other side (i.e. left side) of the clip 53. A thread formed on the outer circumference of the body 522a may be fastened to a thread formed on the inner circumference of the body 521a of the shaft 521. A head 522b of the pin 522 may be inserted into a hole 53H of the clip 53.

A bush 523 may be located between the head 522b of the pin 522 and the first end fitting 52a, and the body 521a of the shaft 521 may be inserted into the bush 523. At this time, the inner surface of the bush 523 may have a shape corresponding to that of the outer surface of the body 521a. In addition, the bush 523 may have a cylindrical shape with a portion of the outer surface thereof cut-out, and a pair of cut-outs (unlabeled) may be opposite to each other. A pair of protrusions 53W may protrude from a boundary surface of the hole 53H of the clip 53, and may contact the pair of cut-outs. Thus, the bush 523 and the shaft 521 may be fixed to the clip 53, and the pin 522 may be fixed to the shaft 521.

A washer 524 may be located on a surface of the first end fitting 52a, and the body 521a of the shaft 521 may penetrate the washer 524. The washer 524 may be a flat washer that contacts the clip 53 or the bush 523. Alternatively, the washer 524 may be a convex washer in the form of a disc spring. In this case, a frictional force between the washer 524 and the first end fitting 52a may increase. The first washer 524a may be sandwiched between the bush 523 and the left side of the first end fitting 52a. The second washer

524b may be sandwiched between the inner rib 53R of the clip 53 and the right side of the first end fitting 52a.

Thus, the supporter 51 and 52 may rotate about the shaft 521, and friction may occur between the rotating supporter 51 and 52 and the washer 524. A user may adjust the frictional force applied to the supporter 51 and 52 by adjusting a fastening length (degree) between the pin 522 and the shaft 521. The bush 523 and the inner rib 53R may block the rotating force of the supporter 51 and 52 from being transmitted to the head 522b of the pin 522 and the head 521b of the shaft 521. As a result, even if the supporter 51 and 52 are rotated, the shaft 521 and the pin 522 may not be disengaged.

Moreover, the disc spring 525 may be located between the head 522b of the pin 522 and the bush 523, and the body 522a of the pin 522 may penetrate the disc spring 525. The washer 526 may be located between the disc spring 525 and the bush 523, and the body 522a of the pin 522 may penetrate the washer 526. The disc spring 525 may have elasticity, and may be convex toward the head 522b of the pin 522 or the bush 523. That is, the disc spring 525 may generate an elastic force in an axial direction of the pin 522.

Thus, larger friction may occur between the rotating supporter 51 and 52 and the washer 524. A user may adjust the frictional force applied to the supporter 51 and 52 by adjusting the fastening length (degree) between the pin 522 and the shaft 521.

The lower arm 54 may surround a portion of the supporter 51 and 52. A first lower pin Fq may sequentially penetrate a first hole 542a of the second lower bar 542, a lower hole 53Q of the clip 53, and a first hole 541a of the first lower bar 541, and a first lower fixer Nq may be fastened to an end of the first lower pin Fq. The first holes 542a and 541a may be angular holes, and the first lower pin Fq may also have an angular side to correspond thereto. For example, the first lower pin Fq may be a bolt, while the first lower fixer Nq may be a nut. Thus, the lower arm 54 may be coupled to the clip 53 to be rotatable about the first lower pin Fq along with the first lower pin Fq. Meanwhile, the washer(s) and/or the disc spring(s) may be located between the head of the first lower pin Fq and the right side of the second lower bar 542, or between the first lower fixer Nq and the left side of the first lower bar 541, and may provide a frictional force against the rotation of the lower arm 54.

The upper arm 55 may surround a portion of the lower arm 54. A first upper pin Fp may sequentially penetrate a first hole 552a of the second upper bar 552, an upper hole 53P of the clip 53, and a first hole 551a of the second upper bar 551, and a first upper fixer Np may be fastened to an end of the first upper pin Fp. The first holes 552a and 551a may be round holes, and the first upper pin Fp may also have a round side to correspond thereto. For example, the first upper pin Fp may be a rivet, and the first upper fixer Np may be a portion of the rivet. Thus, the upper arm 55 may be coupled to the clip 53 to be rotatable about the first upper pin Fp. Meanwhile, the washer(s) and/or the disc spring(s) may be located between the head of the first upper pin Fp and the right side of the second upper bar 552, or between the first upper fixer Np and the left side of the first upper bar 551, and may provide a frictional force against the rotation of the upper arm 55.

Figure 10:
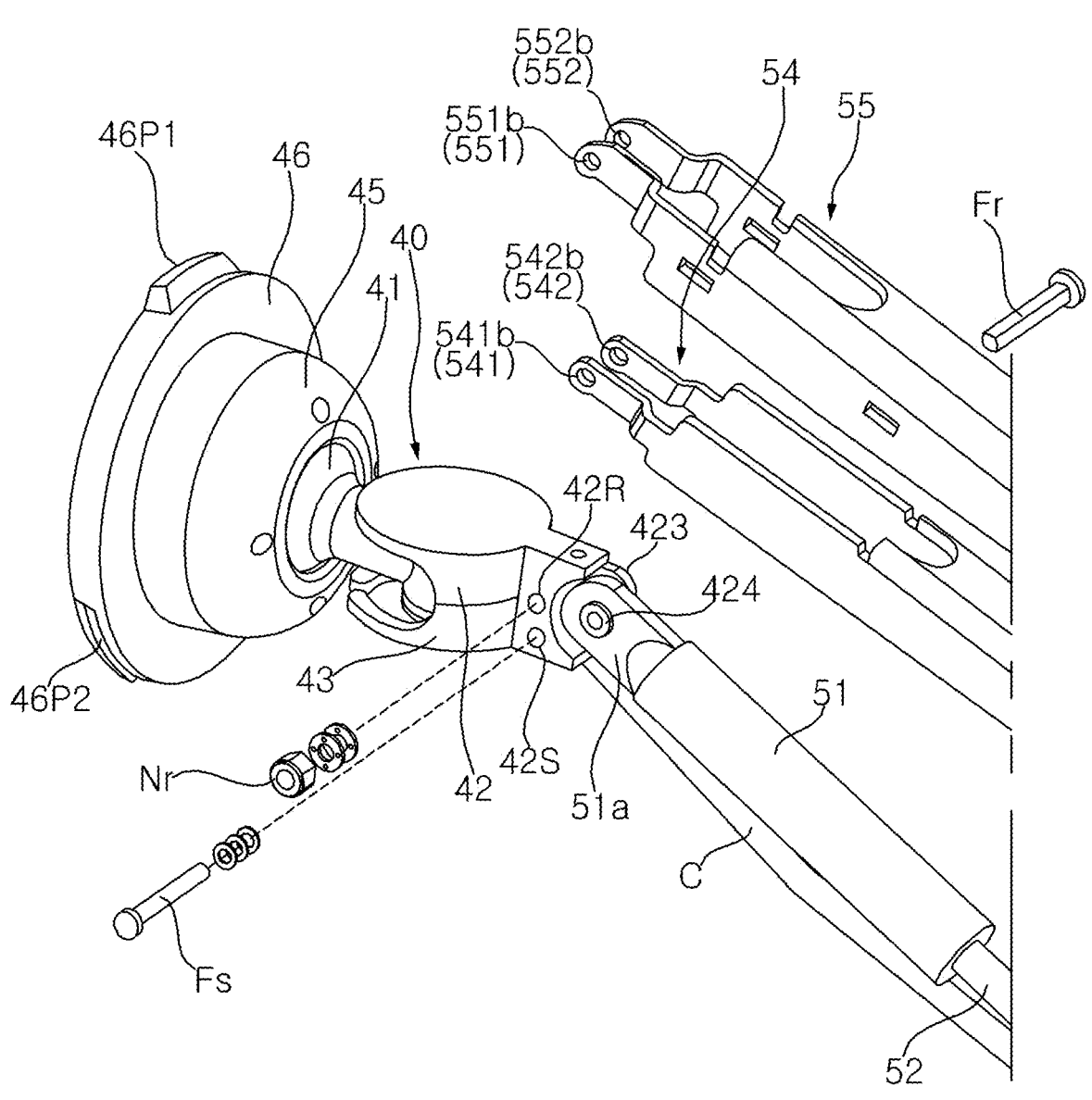
Figure 11:
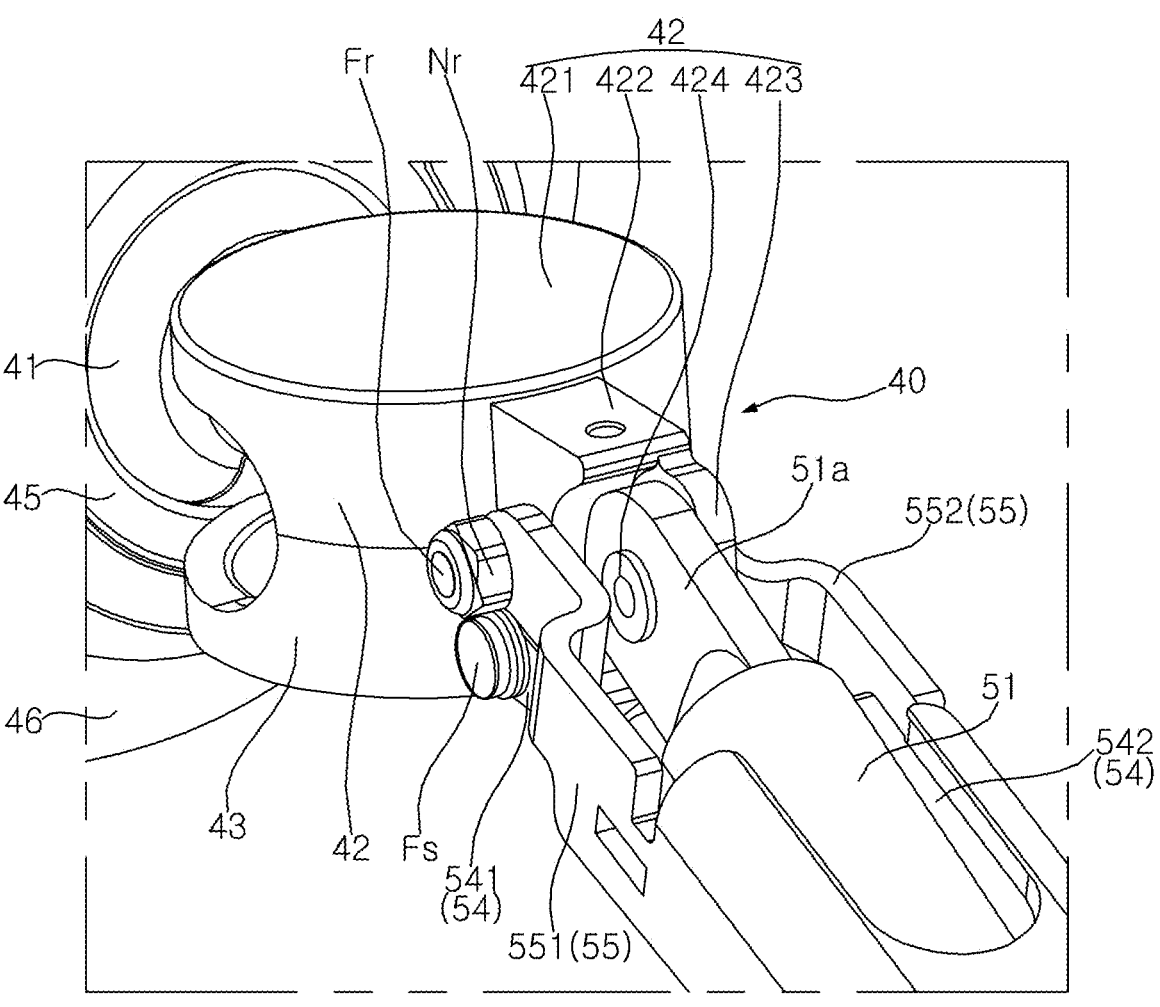
Figure 12:
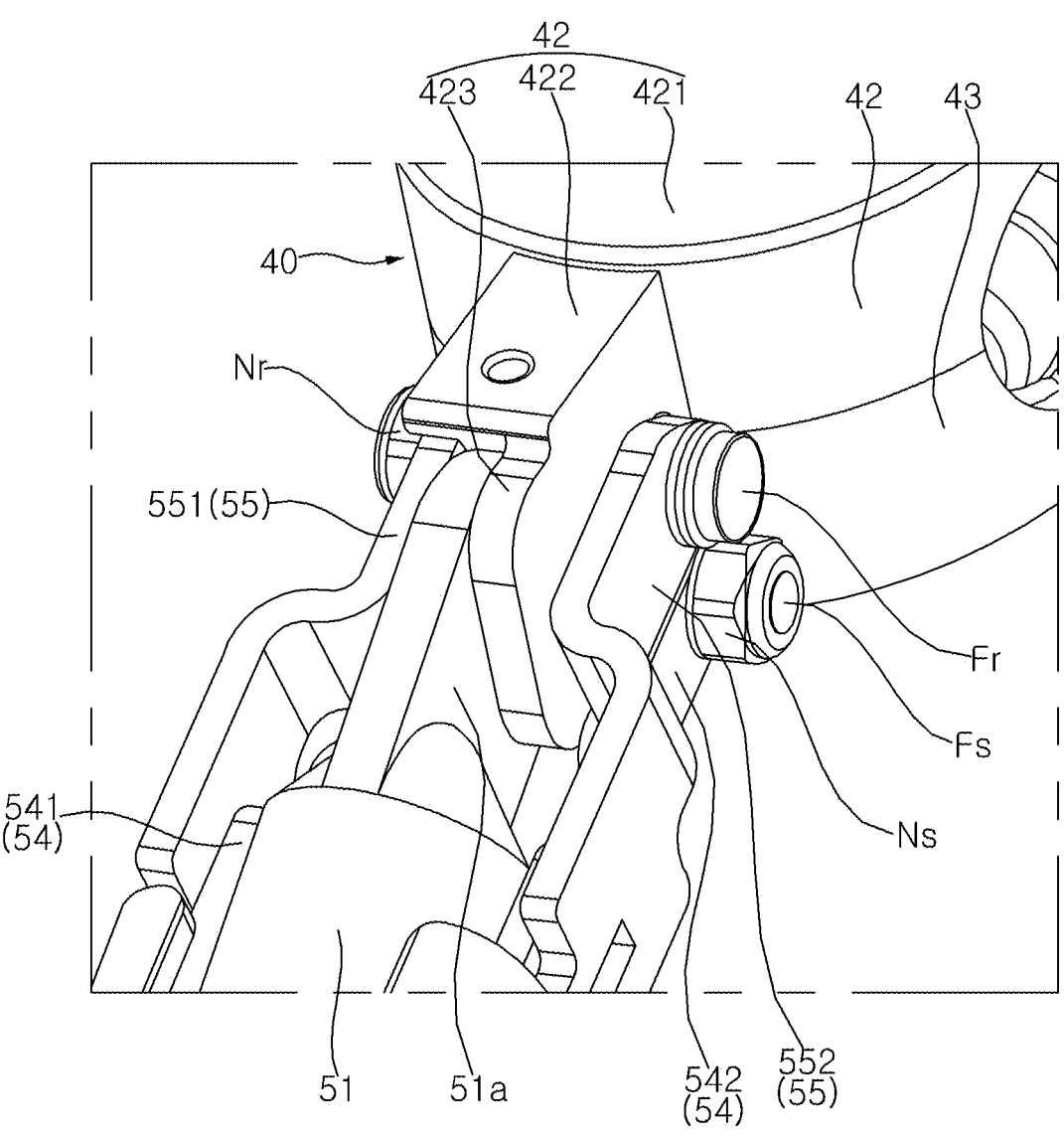

Referring to FIGS. 10 to 12, a second end fitting 51a may protrude from an end of the cylinder 51. A boss 424 of the rotary connector 40 may penetrate the second end fitting 51a. Here, the boss 424 may protrude from a groove 423 of a rear part 422 of the rotary connector 40. The supporter 51 and 52 may be coupled to the rotary connector 40 to be rotatable about the boss 424.

The lower arm 54 may surround a portion of the supporter 51 and 52. A second lower pin Fs may sequentially penetrate a second hole 541b of the first lower bar 541, a lower hole 42S of the rear part 422, and a second hole 542b of the second lower bar 542, and a second lower fixer Ns may be fastened to an end of the second lower pin Fs. The second holes 541b and 542b may be angular holes, and the second lower pin Fs may also have an angular side to correspond thereto. For example, the second lower pin Fs may be a bolt, while the second lower fixer Ns may be a nut. Thus, the lower arm 54 may be coupled to the rotatable connector 40 to be rotatable about the second lower pin Fs along with the second lower pin Fs. Meanwhile, the washer(s) and/or the disc spring(s) may be located between the head of the second lower pin Fs and the left side of the first lower bar 541, or between the second lower fixer Ns and the right side of the second lower bar 542, and may provide a frictional force against the rotation of the lower arm 54.

The upper arm 55 may surround a portion of the lower arm 54. A second upper pin Fr may sequentially penetrate a second hole 552b of the second upper bar 552, an upper hole 42R of the rear part 422, and a second hole 551b of the first upper bar 551, and a second upper fixer Nr may be fastened to an end of the second upper pin Fr. The second holes 552b and 551b may be angular holes, and the second upper pin Fr may also have an angular side to correspond thereto. For example, the second upper pin Fr may be a bolt, and the second upper fixer Fr may be a nut. Thus, the upper arm 55 may be coupled to the rotary connector 40 to be rotatable about the second upper pin Fr along with the second upper pin Fr. Meanwhile, the washer(s) and/or the disc spring(s) may be located between the head of the second upper pin Fr and the right side of the second upper bar 552, or between the second upper fixer Nr and the left side of the first upper bar 551, and may provide a frictional force against the rotation of the upper arm 55.

Figure 13:
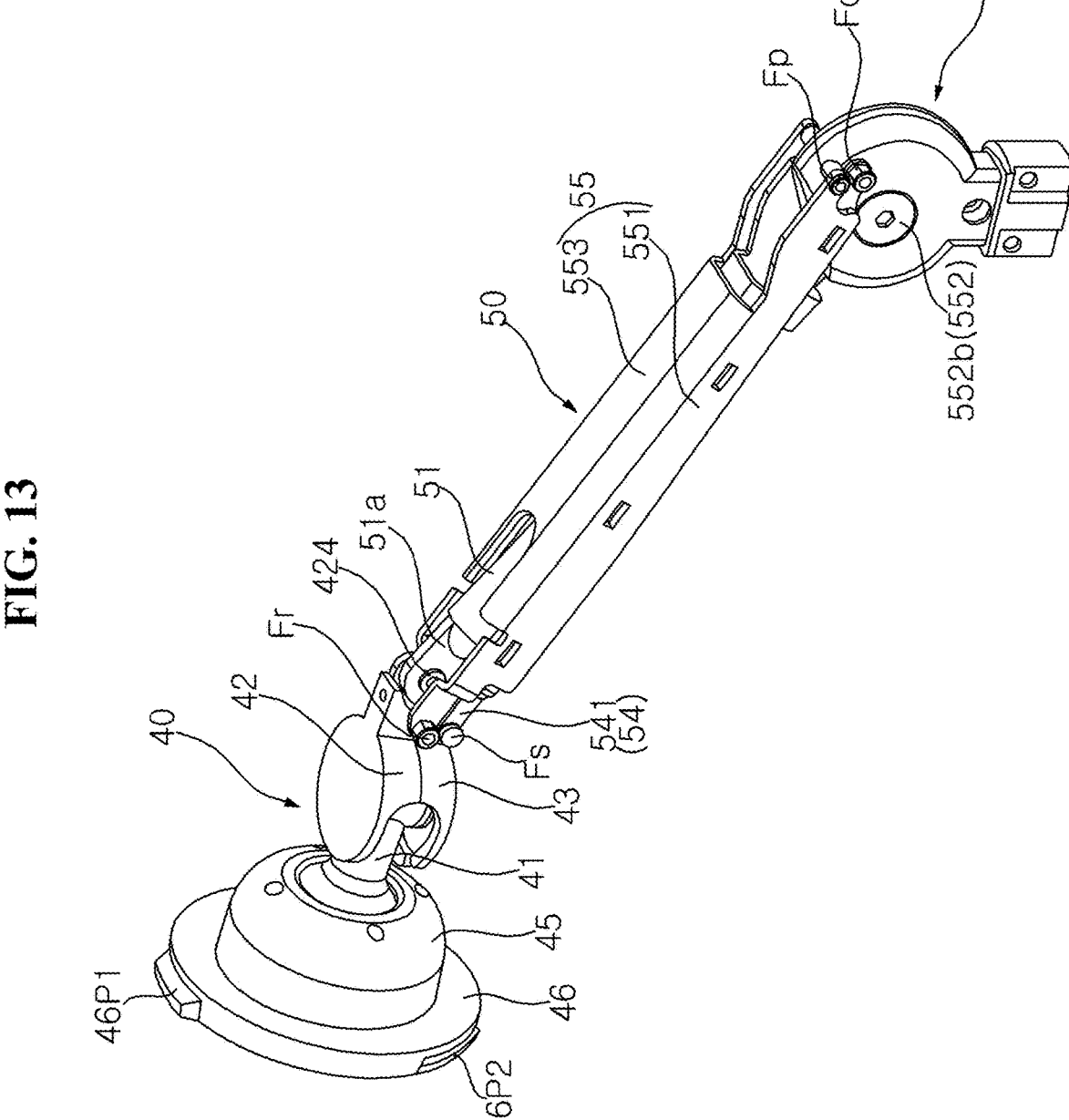
Figure 14:
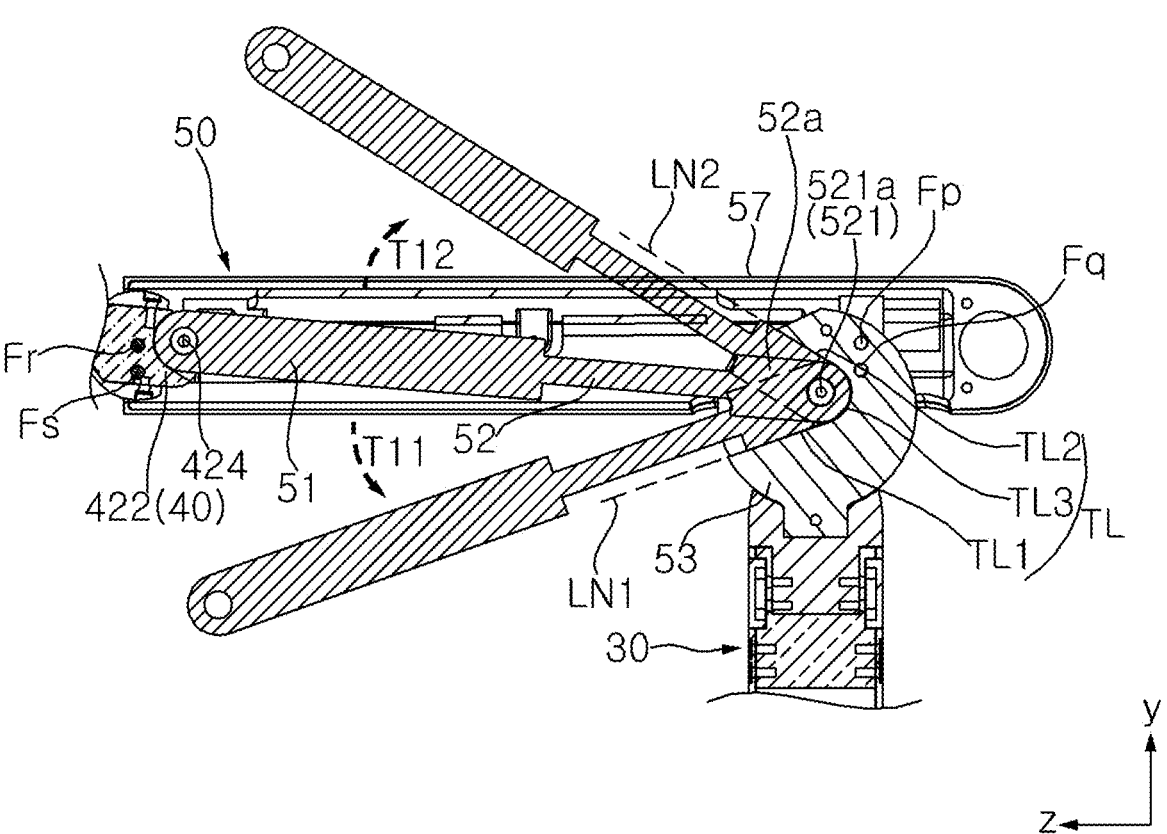

Referring to FIGS. 13 and 14, an arm cover 57 may surround the supporter 51 and 52, the lower arm 54, and the upper arm 55, and may form the surface of the support arm 50. A portion of the clip 53 may be located in the arm cover 57.

A stepped portion TL may be formed in the clip 53, and may provide a groove into which the first end fitting 52a is movably inserted. A first straight portion TL1 of the stepped portion TL may extend along a first straight line LN1. A second straight portion TL2 of the stepped portion TL may extend along a second straight line LN2. A curved portion TL3 of the stepped portion TL may connect the first straight portion TL1 and the second straight portion TL2. An angle between the first straight portion TL1 and the second straight portion TL2 may be an acute angle.

A curvature of the curved portion TL3 may correspond to a curvature of an end of the first end fitting 52a, and the end of the first end fitting 52a may contact the curved portion TL3. The supporter 51 and 52 may rotate about the shaft 521 between the first straight portion TL1 and the second straight portion TL2 (see T11 and T12 of FIG. 14). When the first end fitting 52a contacts the first straight portion TL1 or the second straight portion TL2, the rotation of the supporter 51 and 52 may be limited.

Figure 15:
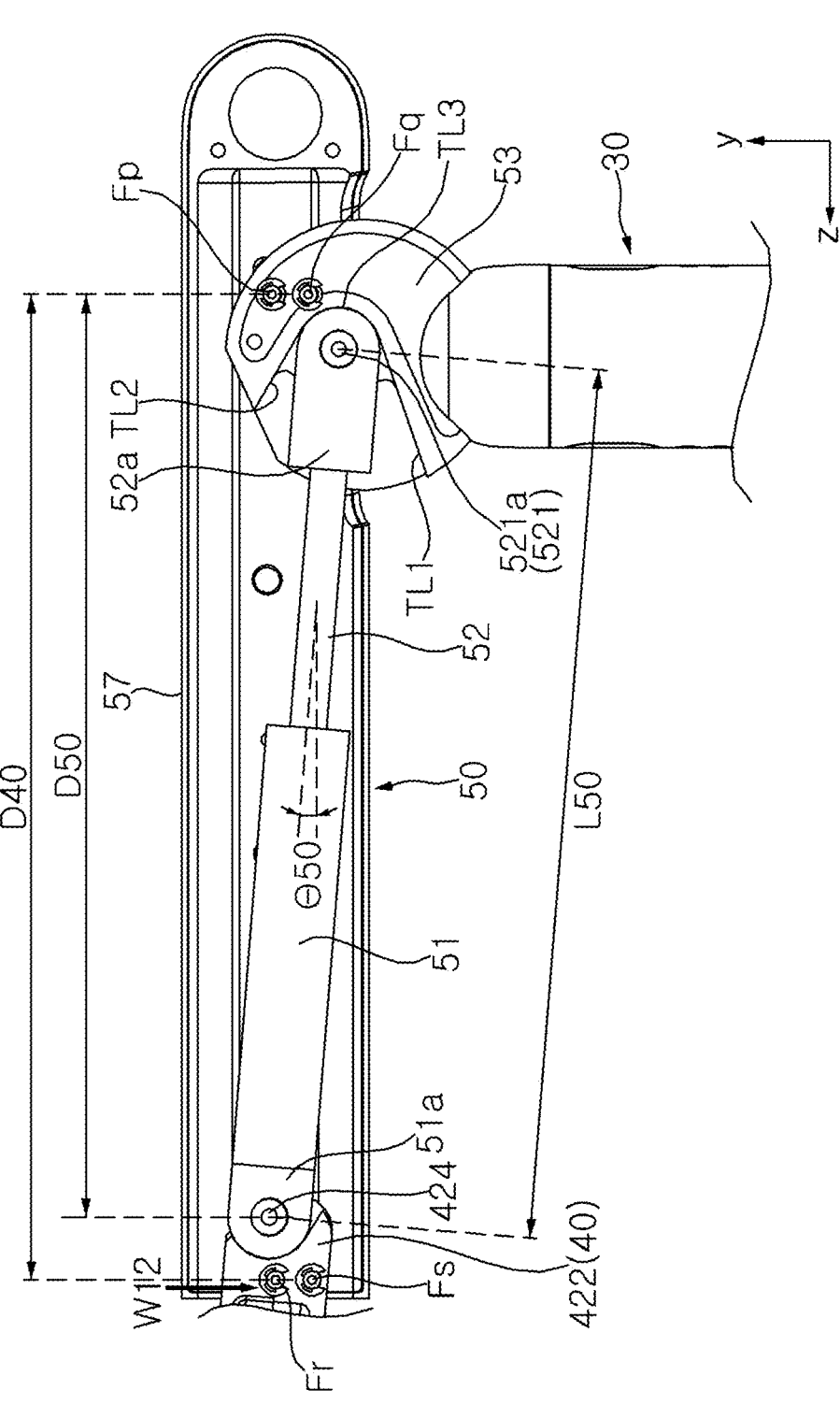
Figure 16:
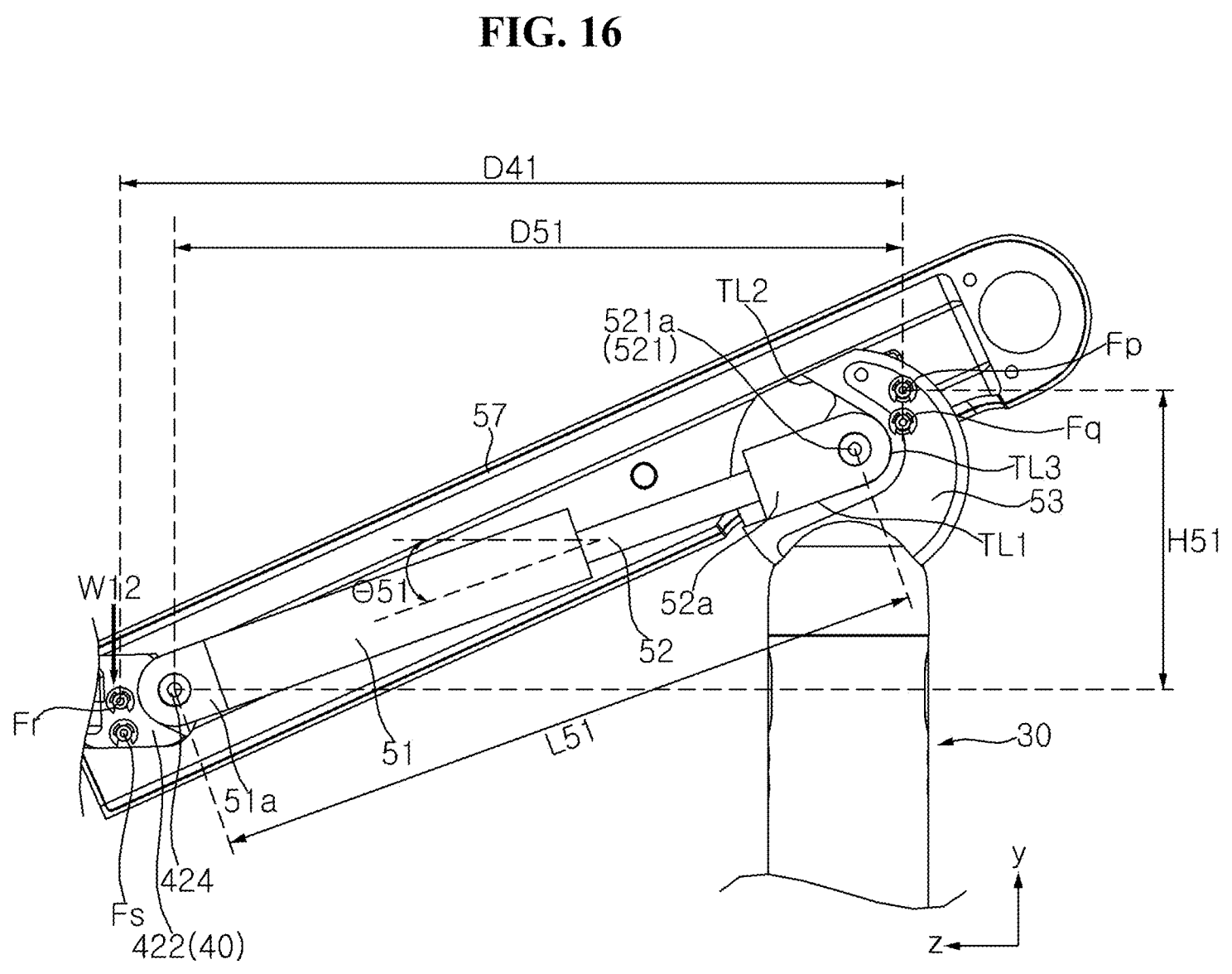
Figure 17:
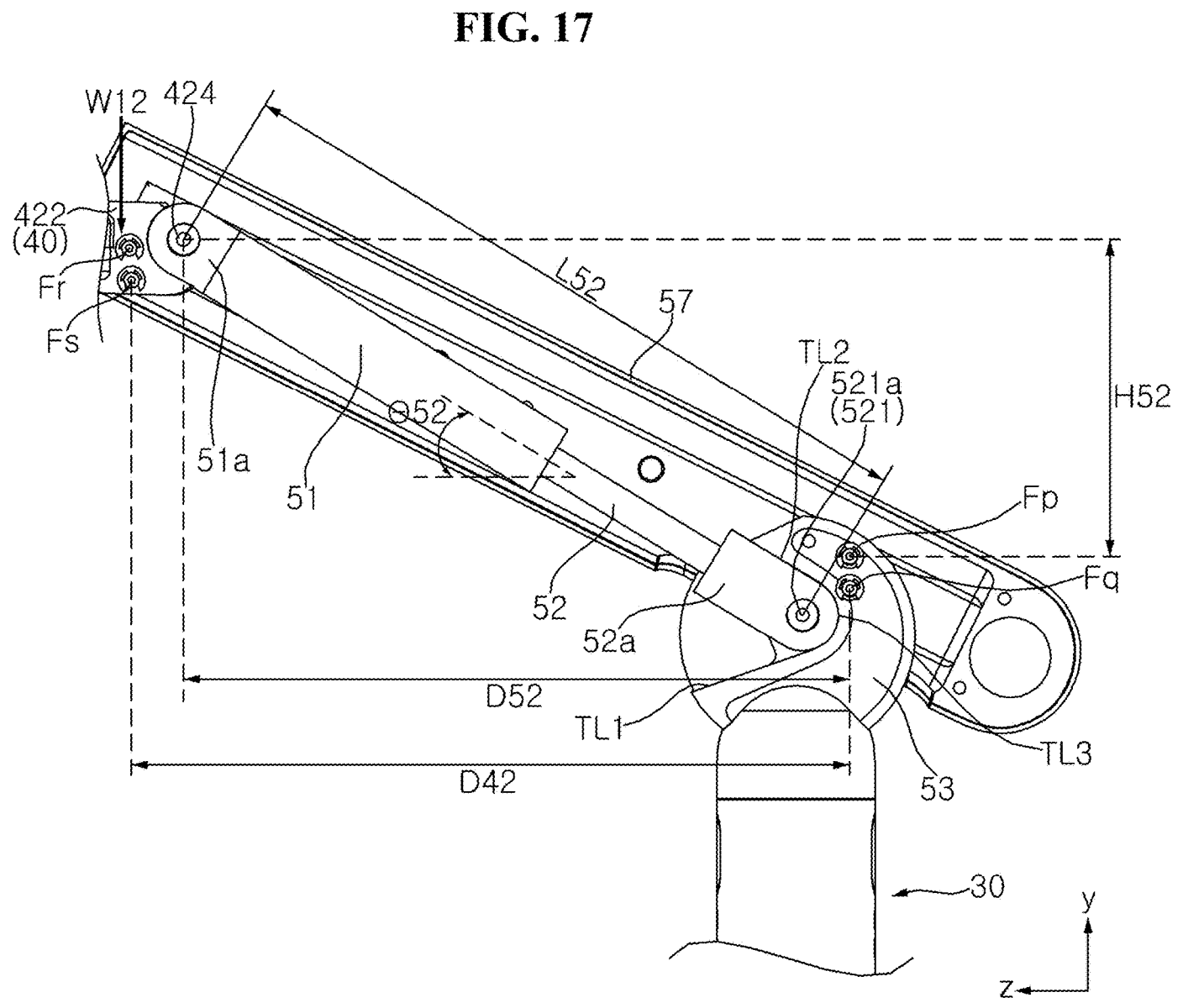

Referring to FIGS. 15 to 17, one end (i.e. the first end fitting 52a) of the supporter 51 and 52 may rotate about the shaft 521, and the other end (i.e. the second end fitting 51a) of the supporter 51 and 52 may rotate about the boss 424.

The shaft 521 may provide a first tilt axis, and the first lower pin Fq and the first upper pin Fp may be located in back of the first tilt axis. The boss 424 may provide a second tilt axis, and the second lower pin Fs and the second upper pin Fr may be located in front of the second tilt axis. The first lower pin Fq and the first upper pin Fp may be located on a first vertical line, and may be collectively referred to as the first pins Fq and Fp. The second lower pin Fs and the second upper pin Fr may be located on a second vertical line, and may be collectively referred to as the second pins Fs and Fr.

The lengths of the supporter 51 and 52 may be varied by the rotation (tilting) of the supporter 51 and 52, and the supporter 51 and 52 may provide a force that may offset moment applied to the rotary connector 40 by the load of the head 10 (see FIG. 2).

Referring to FIG. 15, the support arm 50 may be aligned with a horizontal line. Moment for lowering the rear part 422 of the rotary connector 40 may be a product of a force W12 acting on the rear part 422 and a horizontal distance D40 between the first pins Fq and Fp and the second pins Fs and Fr. Moment for raising the rear part 422 provided by the supporter 51 and 52 is a product of the force of the supporter 51 and 52, Sin (theta 50), and a horizontal distance D50 between the first pins Fq and Fp and the boss 424. Here, theta 50 may be an angle between the horizontal line and the supporter 51 and 52. When the moment for lowering the rear part 422 and the moment for raising the rear part are in equilibrium, the support arm 50 may be maintained to be parallel to the front-rear direction.

Referring to FIG. 16, the support arm 50 may be inclined downward from the horizontal line by a predetermined angle. Moment for lowering the rear part 422 of the rotary connector 40 may be a product of a force W12 acting on the rear part 422 and a horizontal distance D41 between the first pins Fq and Fp and the second pins Fs and Fr. Moment for raising the rear part 422 provided by the supporter 51 and 52 is a product of the force of the supporter 51 and 52, Sin (theta 51), and a horizontal distance D51 between the first pins Fq and Fp and the boss 424. Here, theta 51 may be an angle between the horizontal line and the supporter 51 and 52. The length L51 of the supporter 51 and 52 may be smaller than the length L50 (see FIG. 15) of the supporter 51 and 52 of the support arm 50 parallel to the horizontal line. When the moment for lowering the rear part 422 and the moment for raising the rear part are in equilibrium, the downward inclined state of the support arm 50 may be maintained.

Referring to FIG. 17, the support arm 50 may be inclined upward from the horizontal line by a predetermined angle. Moment for lowering the rear part 422 of the rotary connector 40 may be a product of a force W12 acting on the rear part 422 and a horizontal distance D42 between the first pins Fq and Fp and the second pins Fs and Fr. Moment for raising the rear part 422 provided by the supporter 51 and 52 is a product of the force of the supporter 51 and 52, Sin (theta 52), and a horizontal distance D52 between the first pins Fq and Fp and the boss 424. Here, theta 52 may be an angle between the horizontal line and the supporter 51 and 52. The length L52 of the supporter 51 and 52 may be greater than the length L50 (see FIG. 15) of the supporter 51 and 52 of the support arm 50 parallel to the horizontal line. When the moment for lowering the rear part 422 and the moment for raising the rear part are in equilibrium, the upward inclined state of the support arm 50 may be maintained.

Turning back to FIGS. 15 to 17, the first pins Fq and Fp, the second pins Fs and Fr, the lower arm 54 (see FIG. 13), and the upper arm 55 may be a four-bar linkage connecting the clip 53 and the rotary connector 40. The first upper pin Fp may be spaced upward from the first lower pin Fq, and the second upper pin Fr may be spaced upward from the second lower pin Fs. A distance between the first upper pin Fp and the first lower pin Fq may be equal to a distance between the second upper pin Fr and the second lower pin Fs.

Thus, regardless of the angle at which the support arm 50 is inclined with respect to the pole 30, the angle of the rear part 422 of the rotary connector 40 with respect to the horizontal line may be kept constant. The display panel 11 (see FIG. 1) of the head 10 may always face forward regardless of the angle of the support arm 50 with respect to the pole 30.

Figure 18:
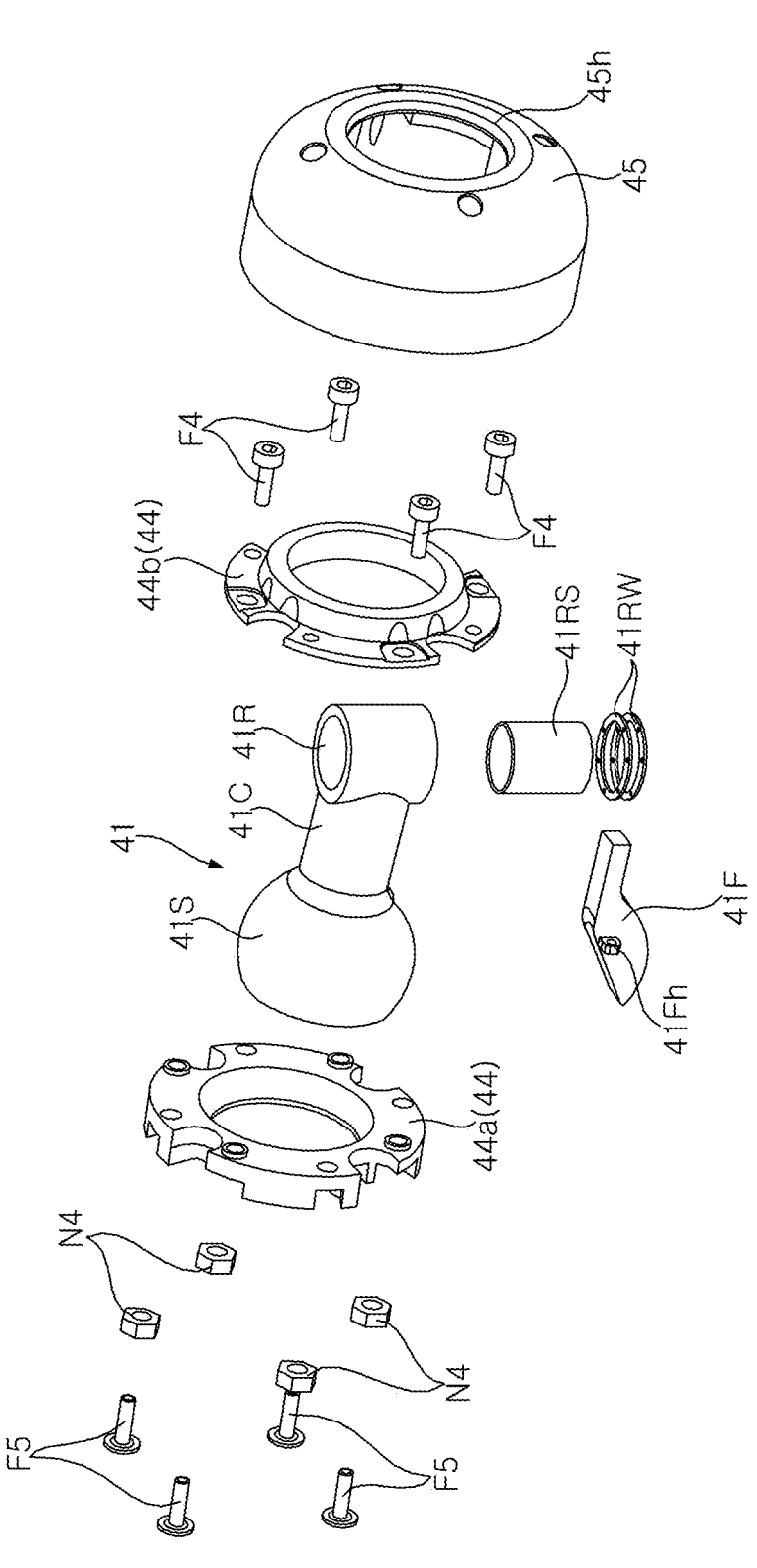
Figure 19:
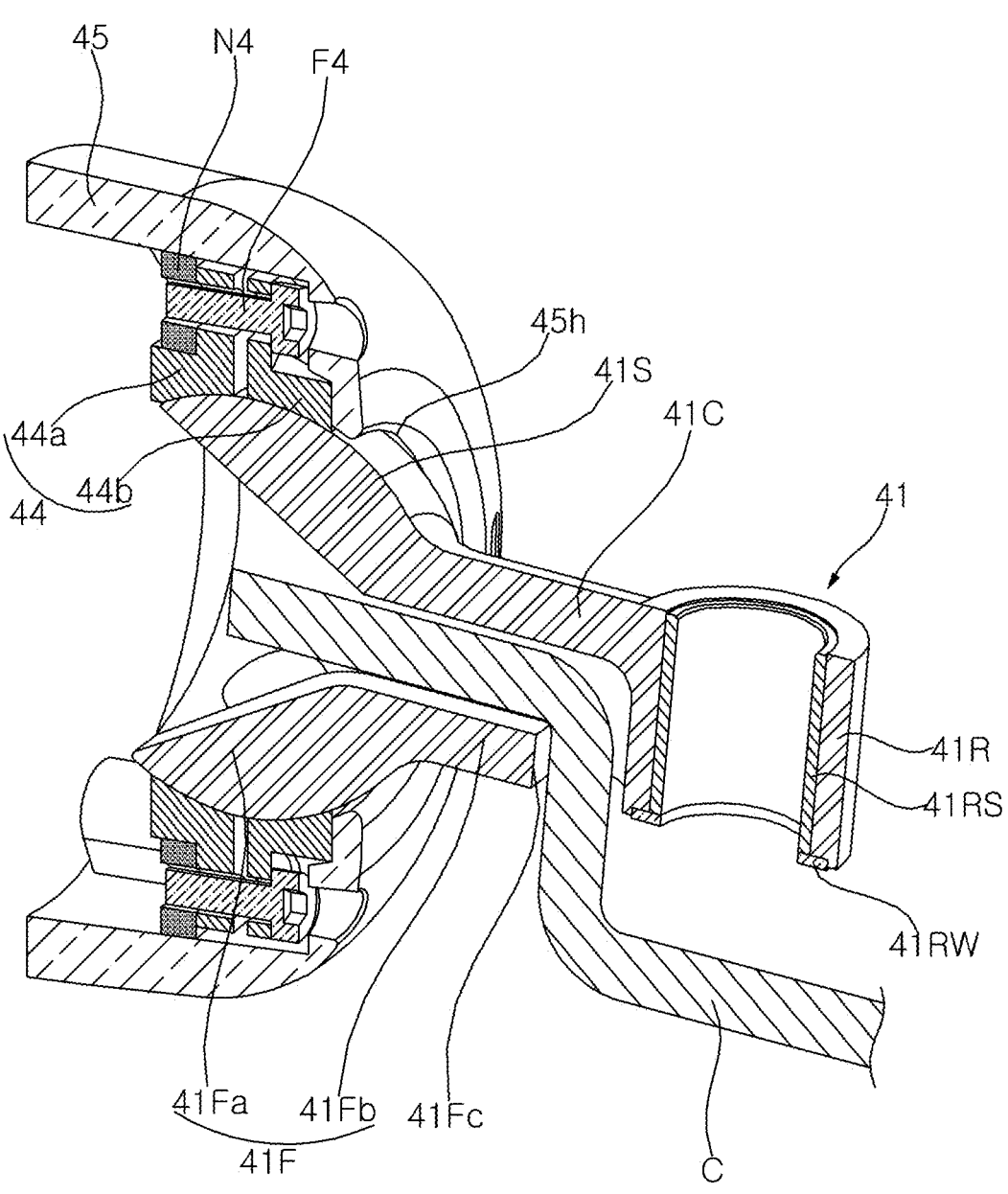

Referring to FIGS. 18 and 19, a housing 45 may have an overall cup shape with a hole 45*h* formed in a center. The housing 45 may be referred to as a ball hinge cover 45.

A ball hinge 41 may penetrate a hole 45*h* of the housing 45. The ball hinge 41 may include a bowl 41S, a stem 41C, a foot 41R, and a cover 41F. The ball hinge 41 may be referred to as a ball joint bracket 41. More than half of the bowl 41S may be located in the housing 45, and the stem 41C may protrude from an outer surface of the bowl 41S. The foot 41R may be opposite to the bowl 41S with respect to the stem 41C.

A portion of the bowl 41S may be cut out, and a portion of the stem 41C may also be cut out. The cover 41F may be inserted into a cut-out portion of the bowl 41S and a cut-out portion of the stem 41C. The bowl 41S and a first part 41Fa of the cover 41F may form the surface of a ball. The stem 41C and a second part 41Fb of the cover 41F may form the surface of a cylinder. A fastening member such as a screw may pass through a hole 41Fh formed in the cover 41F to be fastened to the bowl 41S. As a result, the cover 41F may be detachably coupled to the bowl 41S. The foot 41R may have a ring shape, and a central axis of the foot 41R may intersect a central axis of the stem 41C.

A friction member 44 may contact the outer surfaces of the bowl 41S and cover 41F inside the housing 45. The friction member 44 may have an overall ring shape, and the inner surface of the friction member 44 may be formed along the surface of the ball formed by the bowl 41S and the cover 41F. The surface of the bowl 41S may be plated with chrome. The friction member 44 may include rubber, plastic, resin, glass, or fiber material. The first friction member 44*a* may contact the outer surfaces of the front portions of the bowl 41S and cover 41F. The second friction member 44*b* may contact the outer surfaces of the bowl 41S and the cover 41F at the rear of the first friction member 44*a*. A fastening member F4, such as a bolt, may penetrate the second friction member 44*b* and the first friction member 44*a*, and a fixer N4, such as a nut, may be fastened to an end of the fastening member F4. A fastening member F5, such as a screw, may be fastened to the inner surface of the housing 45 by penetrating the first and second friction members 44*a* and 44*b* coupled to each other. As a result, the first and second friction members 44*a* and 44*b* may be fixed to the housing 45. The friction member 44 may be referred to as a friction washer 44.

Thus, the housing 45 and the friction member 44 may rotate along the surfaces of the bowl 41S and cover 41F of the ball hinge 41, and friction may be generated between the rotating friction member 44 and the surfaces of the bowl 41S and cover 41F. A user may adjust a force with which the friction member 44 is pressed against the outer surfaces of the bowl 41S and cover 41F by adjusting a fastening length (degree) between the fastening member F4 and the fixer N4. That is, as the fastening length of the fastening member F4 and the fixer N4 increases, the friction member 44 may come into closer contact with the surface of the ball hinge 41, and more force may be required to rotate the friction member 44.

Figure 20:
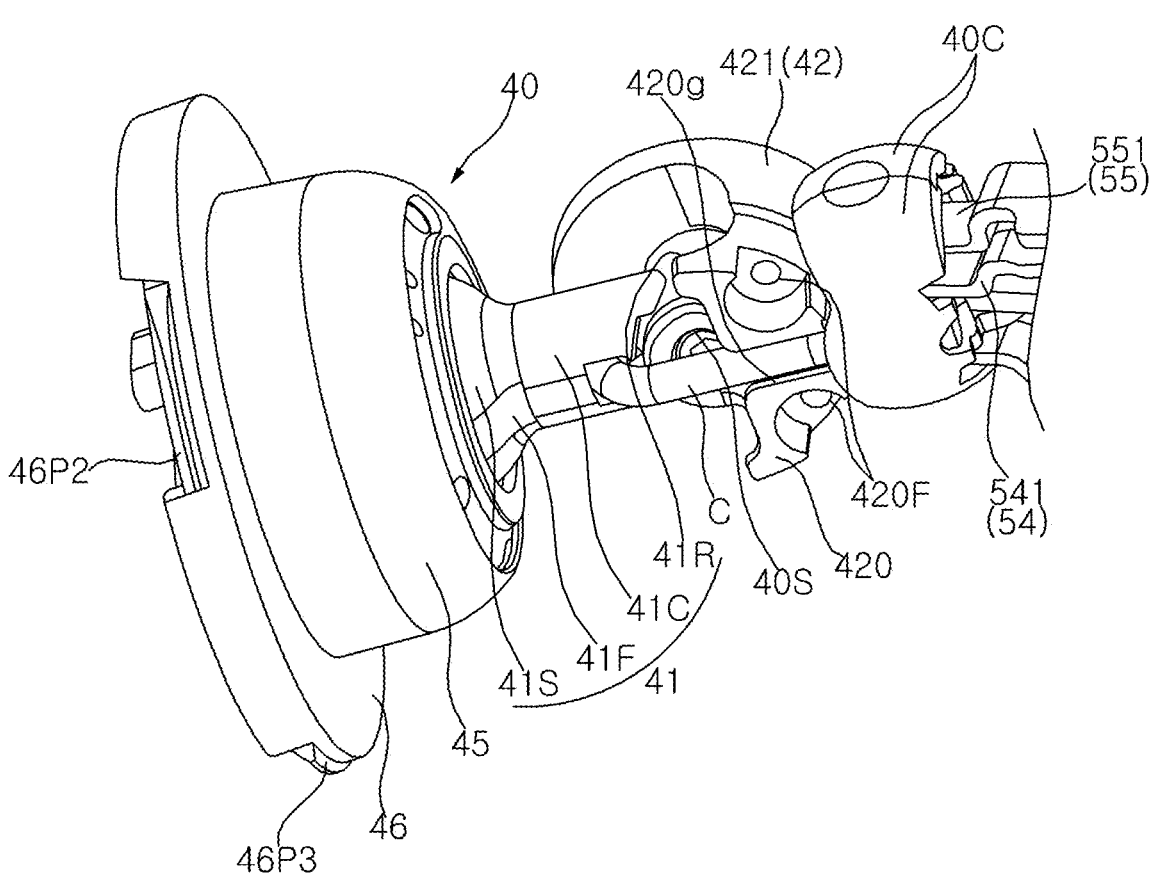
Figure 21:
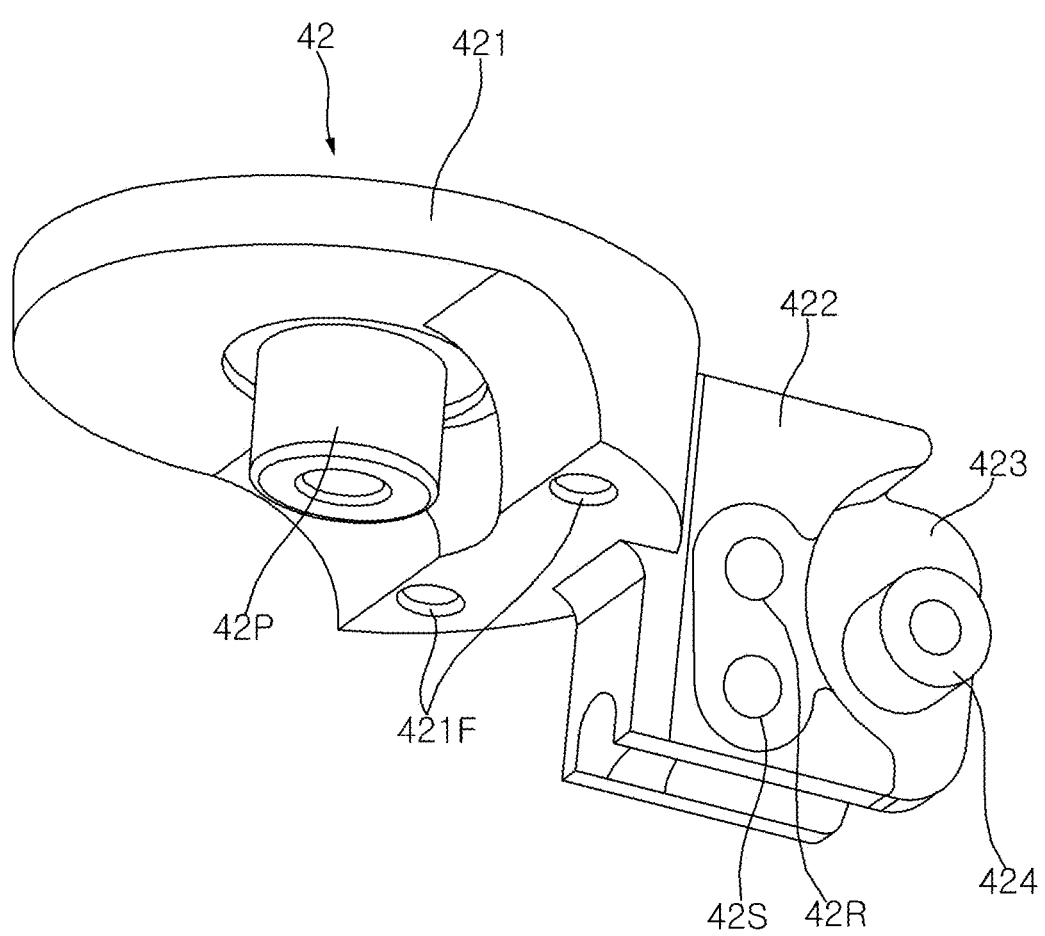
Figure 22:
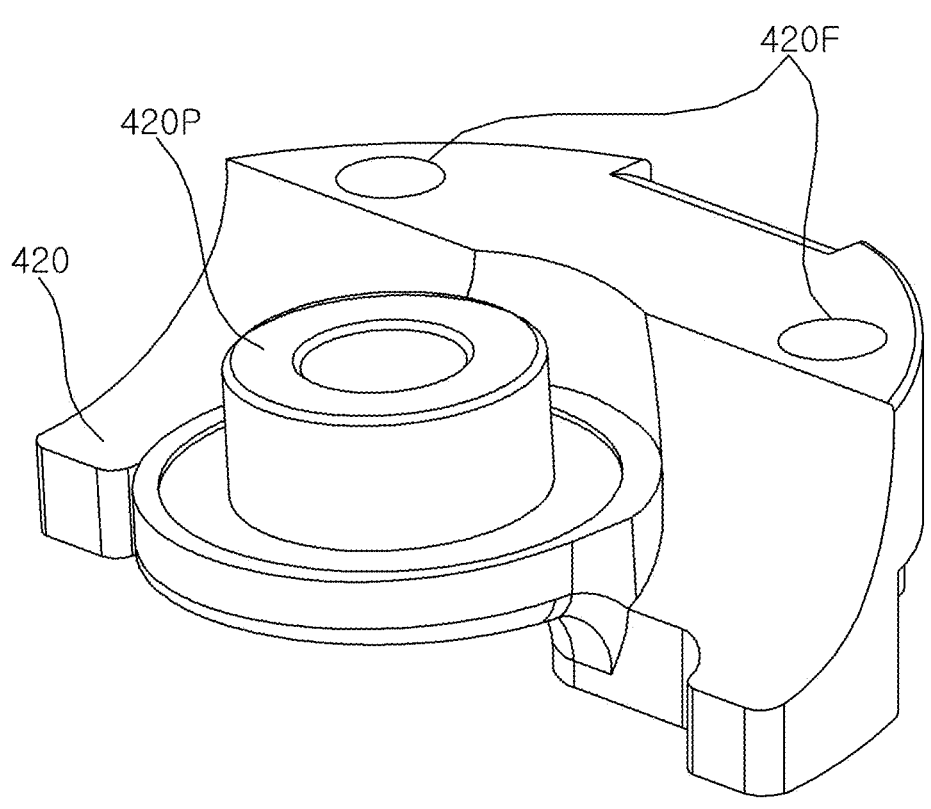

Referring to FIGS. 20 to 22, a joint 42 may include a front part 421 and a rear part 422. The front part 421 may have the shape of a circular plate. The rear part 422 may protrude rearward from the front part 421. The groove 423 may be formed by recessing a surface of the rear part 422, and the second end fitting 51*a* (see FIG. 10) of the supporter 51 and 52 may be seated on the groove 423. The above-described lower hole 42S, upper hole 42R, and boss 424 may be formed in the rear part 422. An upper pin 42P may protrude downward from a lower surface of the front part 421.

A holder 420 may face the front part 421 of the joint 42. A lower pin 420P may protrude from an upper surface of the holder 420 toward the upper pin 42P. A fastening member 40S, such as a screw, may penetrate the lower pin 420P to be fastened to the upper pin 42P. Thus, the holder 420 may be fixed to the joint 42.

Figure 23:
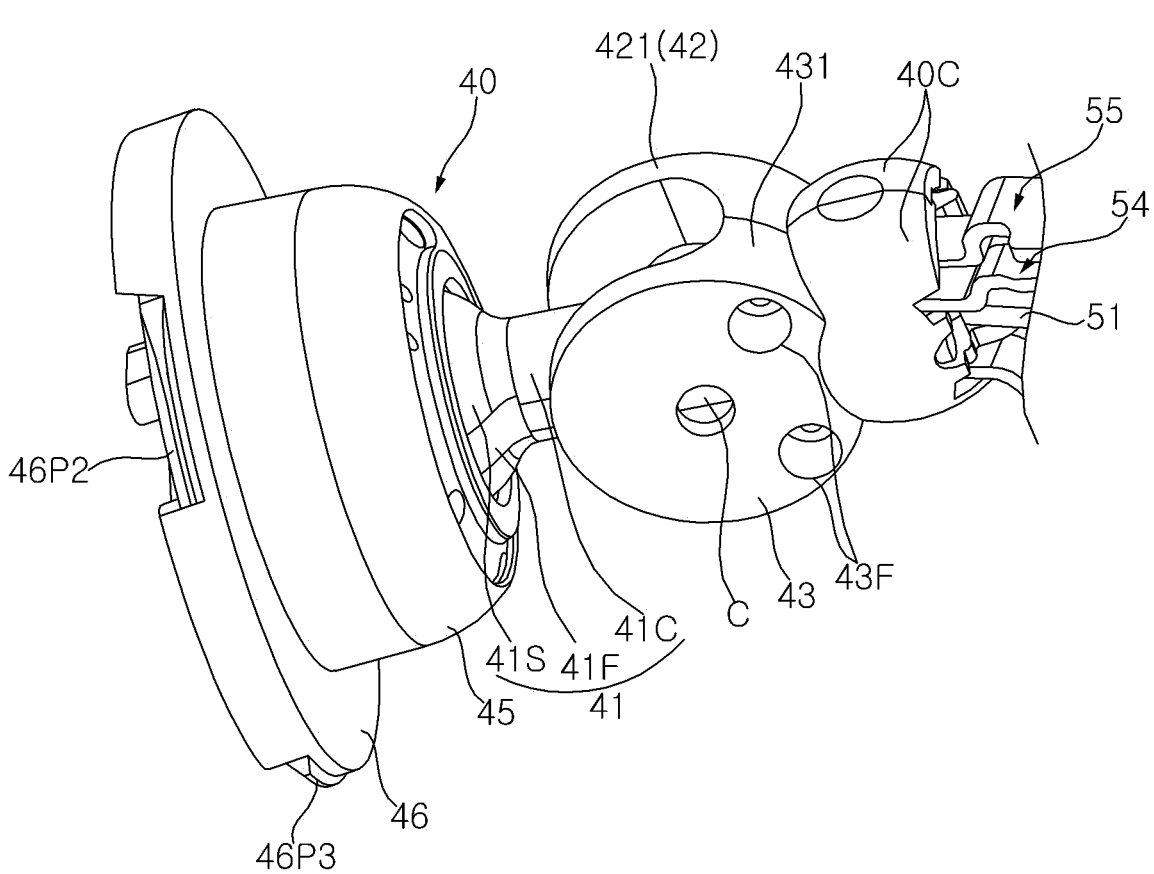
Figure 24:
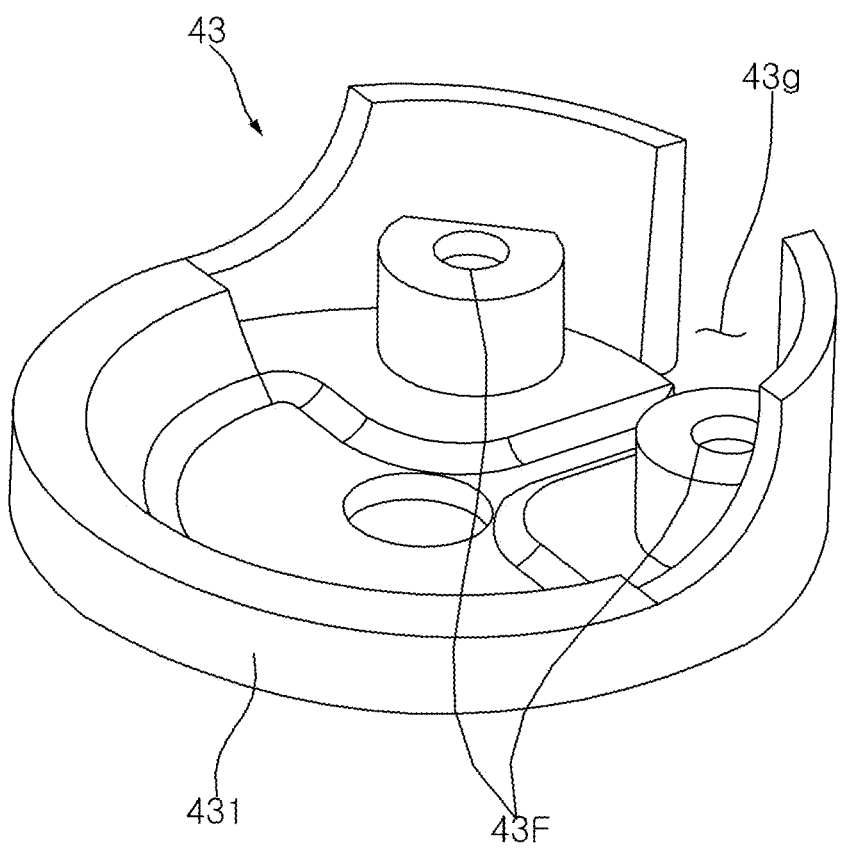

Referring to FIGS. 23 and 24, a cable cover 43 may be opposite to the front part 421 of the joint 42 with respect to the holder 420 (see FIG. 22). A fastening member (not shown), such as a screw, may pass through the hole 43F of the cable cover 43 and the hole 420F of the holder 420 to be fastened to the hole 421F of the front part 421. Thus, cable cover 43 may be fixed to the holder 420 and the joint 42.

Figure 25:
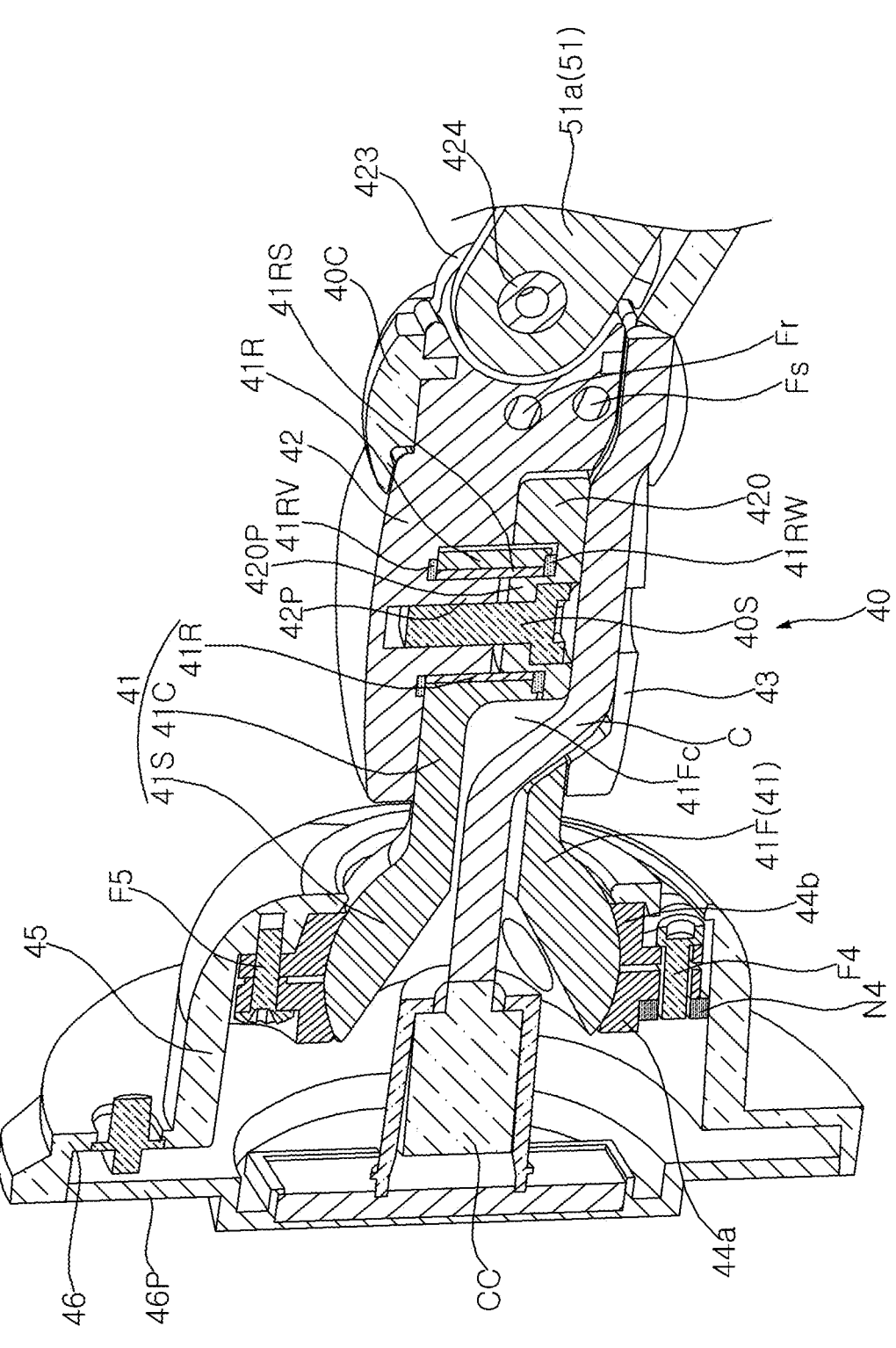
Figure 26:
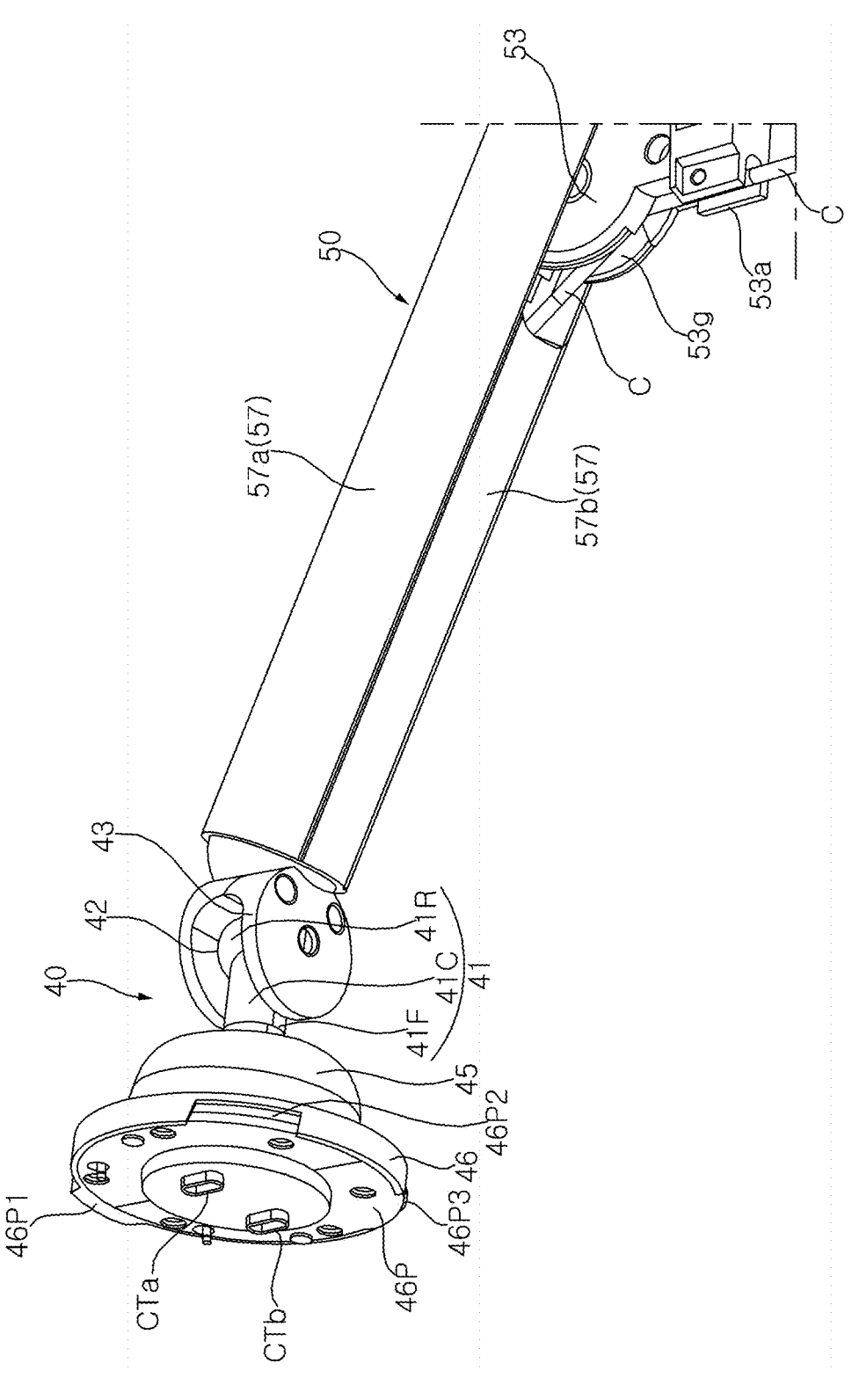

Referring to FIGS. 25 and 26, a foot 41R of the ball hinge 41 may surround a side of the upper pin 42P of the joint 42 and a side of the lower pin 420P of the holder 420. An inner sleeve 41RS may be located between the outer circumferences of the pins 42P and 420P and the inner circumference of the foot 41R. An upper washer 41Rv may be located between the upper end of the inner sleeve 41RS and the joint 42, while a lower washer 41RW may be located between the lower end of the inner sleeve 41RS and the holder 420. Thus, the ball hinge 41 may be coupled to the joint 42 to be rotatable about the fastening member 40S.

A flange 46 may protrude from a front end of the housing 45 in a radial direction of the housing 45, and may extend along the circumference of the housing 45. Protrusions 46P1, 46P2, and 47P3 (see FIGS. 4 and 5) that are fixedly inserted into a groove 1523 of the mounting portion 15G may be formed around the flange 46. A mount plate 46P may cover the front of the housing 45, and may be coupled to the housing 45. The mount plate 46P and the flange 46 may be seated on the seating portions 151 and 152 (see FIG. 5) of the mounting portion 15G.

A cable connector CC may be located in the housing 45, and may be electrically connected to a cable C. Terminals CCa and CCb of the cable connector CC may be exposed the front of the mount plate 46P, and may be electrically connected to terminals 61 and 62 of a connector 60 located in the holes 155*a* and 155*b* of the mounting portion 15G. The connector 60 may be mounted on the rear of the frame 13 (see FIG. 5). The cable connector CC may be located in front of the ball hinge 41, and may be aligned with the ball hinge 41.

The cable C may be disposed inside the bowl 41S and stem 41C of the ball hinge 41. The cover 41F may prevent the cable C disposed inside the bowl 41S and stem 41C from being removed from the bowl 41S and stem 41C. The cable C may extend down the foot 41R through a gap 41Fc (see FIG. 19) between the cover 41F and the stem 41C.

Further, the cable C may be disposed between the holder 420 and the cable cover 43. The holder 420 may be provided with a groove 420*g* (see FIG. 20) where the cable C is located. The cable cover 43 may be formed through a side 431 of the cable cover 43 and may be provided with a hole 43g (see FIG. 24) through which the cable C passes. In addition, the cable C may pass through the inside of a ring cover 40C (see FIG. 20). Thus, the cable C may be concealed in the rotary connector 40.

Further, the cable C may be disposed between the supporter 51 and 52 and a lower cover 57b of the arm cover 57. An upper cover 57a of the arm cover 57 may be detachably coupled to the lower cover 57b. Thus, the cable C may be disposed inside the support arm 50 and along the support arm 50.

Meanwhile, the cable C may be inserted into a groove 53a of the clip 53 and be placed along a pole 30 (see FIG. 2). The cable C may be electrically connected to an electronic component (e.g. a connector of a power cable CW) embedded in the base 20 (see FIG. 2).

Figure 27:
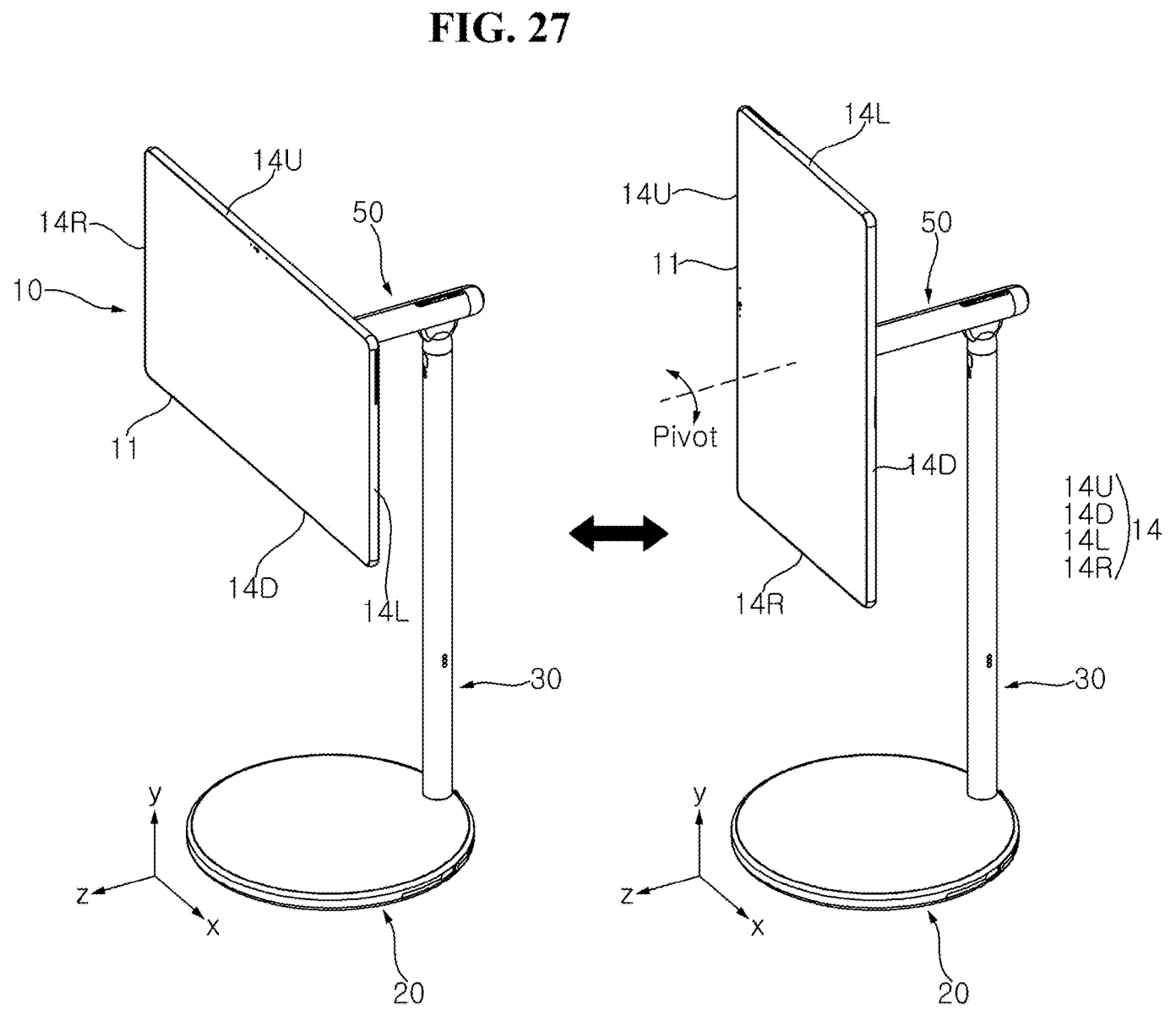

Referring to FIG. 27, the head 10 may be spaced upward from the base 20. A user may pivot or rotate the head 10 with respect to the bowl 41S (see FIG. 25) of the ball hinge 41. At this time, the friction member 44, the housing 45, the flange 46, the mount plate 46P, and the cable connector CC may be pivoted or rotated along with the head 10 (see FIG. 25). Referring to the left diagram of FIG. 27, the head 10 may be placed in a horizontal mode. Referring to the right diagram of FIG. 27, the head 10 may be placed in a vertical mode.

Figure 28:
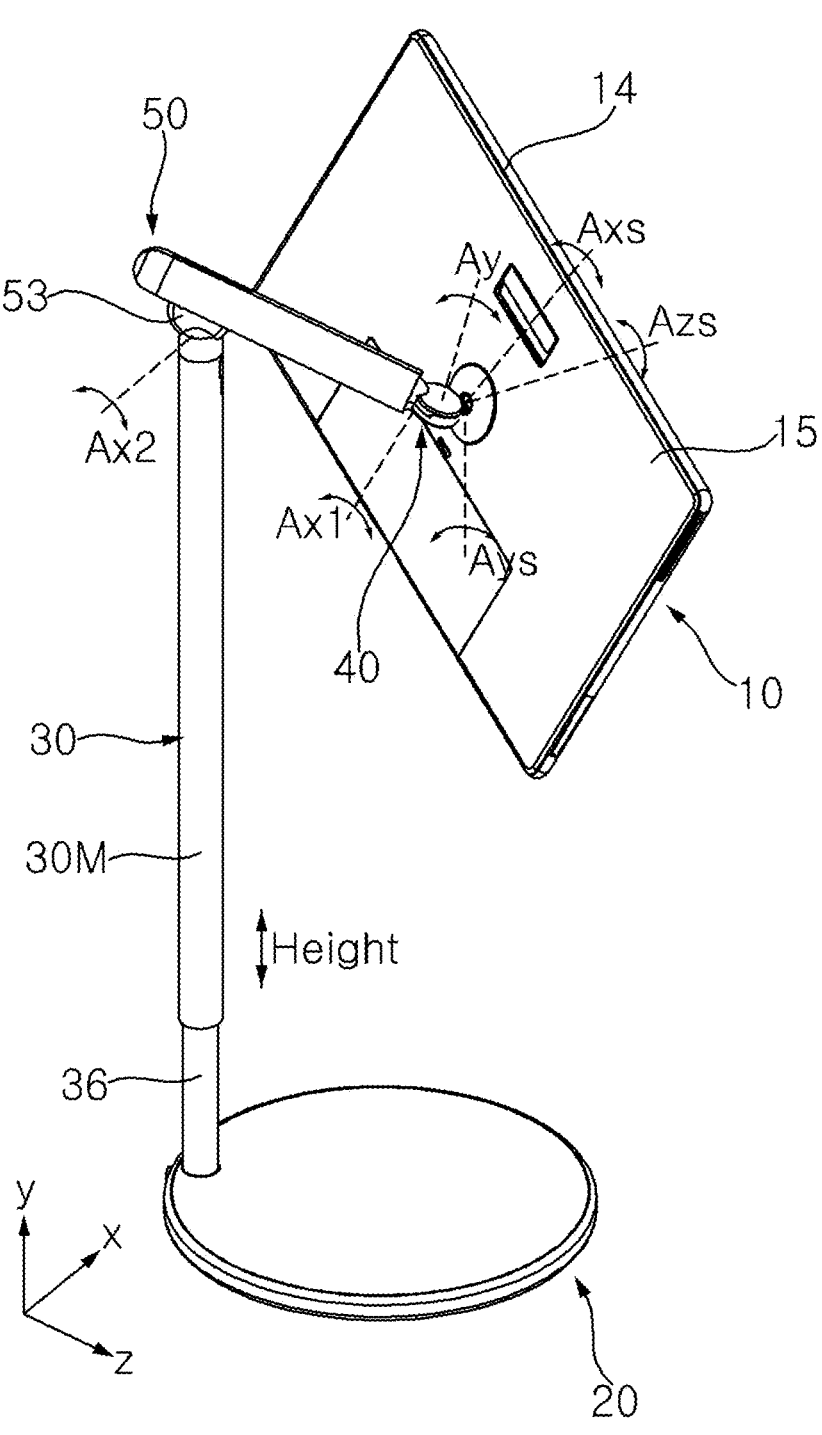

Referring to FIG. 28, a user may tilt the head 10 with respect to the bowl 41S (see FIG. 25) of the ball hinge 41. Alternatively, the user may tilt the head 10 by tilting the support arm 50 with respect to the pole 30.

The user may swivel the head 10 with respect to the bowl 41S (see FIG. 25) of the ball hinge 41. Alternatively, the user may swivel the head 10 by rotating the head 10 about the fastening member 40S (see FIG. 25).

The user may adjust the height of the head 10 by adjusting the length of the pole 30.

Referring to FIGS. 1 to 28, a display device may include a display panel, a clip located behind the display panel, a support arm extending long and located between the display panel and the clip, the support arm including a first end rotatably coupled to the clip and a second end rotatably coupled to the display panel, a shaft penetrating a first side of the clip and the first end of the support arm, fixed to the clip, and providing a rotational central axis of the first end of the support arm, a pin penetrating a second side of the clip opposite to the first side, coupled to the shaft, and including a head opposite to the first end of the support arm, and a first washer located between the head of the pin and the first end of the support arm, and through which the shaft passes, the head of the pin may press the first washer toward the first end of the support arm.

The display device may further include a bush located between the head of the pin and the first washer, and fixed to the clip, and the shaft may be inserted into the bush is fixed to the bush.

The display device may further include a disc spring that is located between the head of the pin and the first washer and is convex toward the head of the pin or the first washer.

The shaft may include a body penetrating the first end of the support arm, and a head protruding from a side of the body and opposite to the first end of the support arm. The display device may further include a second washer located between the head of the shaft and the first end of the support arm, and through which the body of the shaft passes, and the head of the shaft may press the second washer toward the first end of the support arm.

The clip may include an inner rib located between the head of the shaft and the second washer, and on which the head of the shaft is positioned.

The support arm may include a rod extending long in a longitudinal direction of the support arm and forming the first end of the support arm, and a cylinder to which the rod is movably coupled in a longitudinal direction of the rod, and forming the second end of the support arm.

The display device may further include a joint coupled to the display panel, located between the display panel and the support arm, and to which the second end of the support arm is rotatably coupled.

The support arm may further include a lower arm extending along the support arm, the lower arm including a first end rotatably coupled to the clip and a second end rotatably coupled to the joint, and an upper arm opposite to the rod with respect to the lower arm, the upper arm including a first end rotatably coupled to the clip and a second end rotatably coupled to the joint. A distance between a rotational central axis of the first end of the lower arm and a rotational central axis of the first end of the upper arm may be equal to a distance between a rotational central axis of the second end of the lower arm and a rotational central axis of the second end of the upper arm.

The display device may further include a rotary connector connecting the display panel and the support arm, the rotary connector may include a joint to which the second end of the support arm is rotatably coupled, and a ball hinge rotatably coupled to the joint, and a rotational central axis of the ball hinge may intersect a rotational central axis of the second end of the support arm.

The display device may further include a housing surrounding a portion of the ball hinge, and the ball hinge may further include a bowl located in the housing, a stem extending from the bowl toward the joint, and a foot opposite to the bowl with respect to the stem, and rotatably coupled to the joint.

The ball hinge may further include a friction member located between an outer surface of the bowl and an inner surface of the housing and fixed to the housing, and the friction member may contact the outer surface of the bowl.

The friction member may include a first friction member contacting a first outer surface of the bowl, and a second friction member contacting a second outer surface of the bowl, and the ball hinge may further include a fastening member penetrating the first and second friction members, and a fixer fastened to an end of the fastening member.

The display device may further include a cable disposed in the bowl and the stem, a portion of the bowl and a portion of the stem may be cut out, and the ball hinge may further include a cover covering the cut-out portions.

The display device may further include a cable cover opposite to the joint with respect to the foot of the ball hinge and coupled to the joint, and a portion of the cable may be disposed between the foot of the ball hinge and the cable cover.

The display device may further include a pole extending in a direction intersecting the support arm and including one end coupled to the clip, and a base coupled to the other end of the pole.

The effects of a display device according to the present disclosure will be described as follows.

According to at least one of embodiments of the present disclosure, it is possible to provide a display device having a stand that supports a display panel.

According to at least one of embodiments of the present disclosure, it is possible to provide a structure that can freely adjust the angle or height of a display panel.

According to at least one of embodiments of the present disclosure, it is possible to provide a display device with minimized external exposure of a cable.

An additional range of applicability of the present disclosure will be clear from the above description. Those skilled in the art will clearly appreciate that the present disclosure may be variously changed and modified without departing from the idea and scope of the present disclosure. The detailed description and specific embodiments, like preferred embodiments of the present disclosure, are therefore to be construed as illustrative.

Any or other embodiments of the present disclosure described above are not exclusive or distinct from each other. In certain embodiments or other embodiments of the present disclosure described above, components or functions may be used in combination.

For example, this means that component A described in a specific embodiment and/or drawing may be combined with component B described in other embodiments and/or drawings. In other words, even if coupling is not explicitly described, it means that coupling is possible unless it is stated that the coupling is impossible.

The above detailed description should not be construed as restrictive in any way but should be considered as illustrative. The scope of the present disclosure should be determined by reasonable interpretation of the appended claims, and all changes within the equivalent scope of the present disclosure are included in the scope of the present disclosure.

What is claimed is:

1. A display device comprising: a display panel; a clip located behind the display panel; a support arm extending long and located between the display panel and the clip, the support arm including a first end rotatably coupled to the clip and a second end rotatably coupled to the display panel; a shaft penetrating a first side of the clip and the first end of the support arm, fixed to the clip, and providing a rotational central axis of the first end of the support arm; a pin penetrating a second side of the clip opposite to the first side, coupled to the shaft, and including a head opposite to the first end of the support arm; and a first washer located between the head of the pin and the first end of the support arm, and through which the shaft passes, wherein the head of the pir presses the first washer toward the first end of the support arm; and a rotary connector connecting the display panel and the support arm, wherein the rotary connector comprises: a joint to which the second end of the support arm is rotatably coupled; and a ball hinge rotatably coupled to the joint, and wherein a rotational central axis of the ball hinge intersects a rotational central axis of the second end of the support arm; and a housing surrounding a portion of the ball hinge, and wherein the ball hinge further comprises: a bowl located in the housing; a stem extending from the bowl toward the joint; and a foot opposite to the bowl with respect to the stem, and rotatably coupled to the joint.

2. The display device of claim 1, further comprising: a bush located between the head of the pin and the first washer, and fixed to the clip, and wherein the shaft is inserted into the bush and is fixed to the bush.

3. The display device of claim 1, further comprising: a disc spring located between the head of the pin and the first washer, and convex toward the head of the pin or the first washer.

4. The display device of claim 1, wherein the shaft comprises: a body penetrating the first end of the support arm; and a head protruding from a side of the body and opposite to the first end of the support arm, further comprising: a second washer located between the head of the shaft and the first end of the support arm, and through which the body of the shaft passes, and wherein the head of the shaft presses the second washer toward the first end of the support arm.

5. The display device of claim 4, wherein the clip comprises an inner rib located between the head of the shaft and the second washer, and on which the head of the shaft is positioned.

6. The display device of claim 1, wherein the support arm comprises: a rod extending long in a longitudinal direction of the support arm, and forming the first end of the support arm; and a cylinder to which the rod is movably coupled in a longitudinal direction of the rod, and forming the second end of the support arm.

7. The display device of claim 6, further comprising: a joint coupled to the display panel, located between the display panel and the support arm, and to which the second end of the support arm is rotatably coupled.

8. The display device of claim 7, wherein the support arm further comprises: a lower arm extending along the support arm, the lower arm including a first end rotatably coupled to the clip and a second end rotatably coupled to the joint; and an upper arm opposite to the rod with respect to the lower arm, the upper arm including a first end rotatably coupled to the clip and a second end rotatably coupled to the joint, and wherein a distance between a rotational central axis of the first end of the lower arm and a rotational central axis of the first end of the upper arm is equal to a distance between a rotational central axis of the second end of the lower arm and a rotational central axis of the second end of the upper arm.

9. The display device of claim 1, wherein the ball hinge further comprises a friction member located between an outer surface of the bowl and an inner surface of the housing and fixed to the housing, and wherein the friction member contacts the outer surface of the bowl.

10. The display device of claim 9, wherein the friction member comprises: a first friction member contacting a first outer surface of the bowl; and a second friction member contacting a second outer surface of the bowl, and wherein the ball hinge further comprises: a fastening member penetrating the first and second friction members; and a fixer fastened to an end of the fastening member.

11. The display device of claim 1, further comprising: a cable disposed in the bowl and the stem, wherein a portion of the bowl and a portion of the stem are cut out, and wherein the ball hinge further comprises a cover covering the cut-out portions.

12. The display device of claim 11, further comprising:

a cable cover opposite to the joint with respect to the foot of the ball hinge and coupled to the joint, and wherein a portion of the cable is disposed between the foot of the ball hinge and the cable cover.

13. The display device of claim 1, further comprising:

a pole extending in a direction intersecting the support arm, and including one end coupled to the clip; and a base coupled to the other end of the pole.

* * * * *